United States Patent
Ravelli et al.

(10) Patent No.: US 11,380,341 B2
(45) Date of Patent: Jul. 5, 2022

(54) SELECTING PITCH LAG

(71) Applicant: Fraunhofer-Gesellschaft zur Förderung der angewandten Forschung e.V., Munich (DE)

(72) Inventors: Emmanuel Ravelli, Erlangen (DE); Martin Dietz, Nuremberg (DE); Michael Schnabel, Munich (DE); Arthur Tritthart, Erlangen (DE); Alexander Tschekalinskij, Nuremberg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 102 days.

(21) Appl. No.: 16/869,000

(22) Filed: May 7, 2020

(65) Prior Publication Data
US 2020/0273475 A1    Aug. 27, 2020

Related U.S. Application Data

(63) Continuation of application No. PCT/EP2018/080195, filed on Nov. 5, 2018.

(30) Foreign Application Priority Data

Nov. 10, 2017    (EP) .................................... 17201091

(51) Int. Cl.
  *G10L 19/09* (2013.01)
  *G10L 19/26* (2013.01)
  (Continued)

(52) U.S. Cl.
  CPC .............. *G10L 19/09* (2013.01); *G10L 19/26* (2013.01); *G10L 25/90* (2013.01);
  (Continued)

(58) Field of Classification Search
  None
  See application file for complete search history.

(56) References Cited

U.S. PATENT DOCUMENTS

| | | | |
|---|---|---|---|
| 4,972,484 A | 11/1990 | Link et al. | |
| 5,012,517 A | 4/1991 | Chhatwal et al. | |
| (Continued) | | | |

FOREIGN PATENT DOCUMENTS

| | | |
|---|---|---|
| CN | 101140759 A | 3/2008 |
| CN | 102779526 A | 11/2012 |
| (Continued) | | |

OTHER PUBLICATIONS

Sujoy Sarkar, "Examination Report for IN Application No. 202037018091", dated Jun. 1, 2021, Intellectual Property India, India.

(Continued)

*Primary Examiner* — Douglas Godbold
(74) *Attorney, Agent, or Firm* — Novick, Kim & Lee, PLLC; Jae Youn Kim; Jihun Kim

(57) ABSTRACT

In apparatus, methods, and programs for selecting pitch lag, an encoder obtains a first and a second estimates of a pitch lag for a current frame. A selected value is chosen by selection between the first and the second estimates, based on a first and a second correlation measurements. The second estimate is conditioned by the pitch lag selected at the previous frame. The selection is based on a comparison between: a downscaled version of a first correlation measurement associated to the current frame and obtained at a lag corresponding to the first estimate; and a second correlation measurement associated to the current frame and obtained at a lag corresponding to the second estimate.

22 Claims, 13 Drawing Sheets

(51) Int. Cl.
*G10L 25/90* (2013.01)
*H03M 7/30* (2006.01)

(52) U.S. Cl.
CPC ....... *H03M 7/3064* (2013.01); *H03M 7/6005* (2013.01); *H03M 7/6011* (2013.01)

(56) References Cited

U.S. PATENT DOCUMENTS

| | | | |
|---|---|---|---|
| 5,581,653 A | 12/1996 | Todd | |
| 5,651,091 A | 7/1997 | Chen | |
| 5,781,888 A | 7/1998 | Herre | |
| 5,812,971 A | 9/1998 | Herre | |
| 5,819,209 A | 10/1998 | Inoue | |
| 5,909,663 A | 6/1999 | Iijima et al. | |
| 5,999,899 A | 12/1999 | Robinson | |
| 6,018,706 A | 1/2000 | Huang et al. | |
| 6,148,288 A | 11/2000 | Park | |
| 6,167,093 A | 12/2000 | Tsutsui et al. | |
| 6,507,814 B1 | 1/2003 | Gao | |
| 6,570,991 B1 | 5/2003 | Scheirer et al. | |
| 6,665,638 B1* | 12/2003 | Kang | G10L 19/04 704/219 |
| 6,735,561 B1 | 5/2004 | Johnston et al. | |
| 7,009,533 B1 | 3/2006 | Wegener | |
| 7,353,168 B2 | 4/2008 | Chen et al. | |
| 7,395,209 B1 | 7/2008 | Miroslav et al. | |
| 7,539,612 B2 | 5/2009 | Wei-Ge et al. | |
| 7,546,240 B2 | 6/2009 | Wei-Ge et al. | |
| 8,015,000 B2 | 9/2011 | Juin-Hwey et al. | |
| 8,095,359 B2 | 1/2012 | Boehm et al. | |
| 8,280,538 B2 | 10/2012 | Kim et al. | |
| 8,473,301 B2 | 6/2013 | Chen et al. | |
| 8,543,389 B2 | 9/2013 | Ragot et al. | |
| 8,554,549 B2 | 10/2013 | Oshikiri et al. | |
| 8,612,240 B2 | 12/2013 | Fuchs et al. | |
| 8,682,681 B2 | 3/2014 | Fuchs et al. | |
| 8,738,385 B2 | 5/2014 | Chen | |
| 8,751,246 B2 | 6/2014 | Stefan et al. | |
| 8,847,795 B2 | 9/2014 | Faure et al. | |
| 8,891,775 B2 | 11/2014 | Mundt et al. | |
| 8,898,068 B2 | 11/2014 | Fuchs et al. | |
| 9,026,451 B1 | 5/2015 | Kleijn et al. | |
| 9,123,350 B2 | 9/2015 | Zhao et al. | |
| 9,489,961 B2 | 11/2016 | Balazs et al. | |
| 9,595,262 B2 | 3/2017 | Fuchs et al. | |
| 9,978,381 B2 | 5/2018 | Venkatraman et al. | |
| 10,242,688 B2 | 3/2019 | Martin et al. | |
| 10,296,959 B1 | 5/2019 | Chernikhova et al. | |
| 10,726,854 B2 | 7/2020 | Ghido et al. | |
| 2001/0026327 A1 | 10/2001 | Schreiber et al. | |
| 2003/0101050 A1 | 5/2003 | Vladimir et al. | |
| 2004/0158462 A1 | 8/2004 | Rutledge et al. | |
| 2004/0162866 A1 | 8/2004 | Malvar et al. | |
| 2005/0010395 A1 | 1/2005 | Chiu et al. | |
| 2005/0015249 A1 | 1/2005 | Wei-Ge et al. | |
| 2005/0192799 A1 | 9/2005 | Kim et al. | |
| 2005/0246178 A1 | 11/2005 | Fejzo | |
| 2006/0288851 A1 | 12/2006 | Naoki et al. | |
| 2007/0033056 A1 | 2/2007 | Alexander et al. | |
| 2007/0078646 A1 | 4/2007 | Lei et al. | |
| 2007/0118361 A1 | 5/2007 | Sinha et al. | |
| 2007/0118369 A1 | 5/2007 | Chen | |
| 2007/0124136 A1 | 5/2007 | Den Brinker et al. | |
| 2007/0127729 A1 | 6/2007 | Breebaart et al. | |
| 2007/0129940 A1 | 6/2007 | Geyersberger et al. | |
| 2007/0154031 A1 | 7/2007 | Avendano et al. | |
| 2007/0276656 A1 | 11/2007 | Solbach et al. | |
| 2008/0033718 A1 | 2/2008 | Zopf et al. | |
| 2008/0091418 A1 | 4/2008 | Laaksonen et al. | |
| 2008/0126086 A1 | 5/2008 | Kandhadai et al. | |
| 2008/0126096 A1 | 5/2008 | Choo et al. | |
| 2009/0076805 A1 | 3/2009 | Zhengzhong et al. | |
| 2009/0076830 A1 | 3/2009 | Taleb | |
| 2009/0089050 A1* | 4/2009 | Mo | G10L 19/005 704/207 |
| 2009/0138267 A1 | 5/2009 | Davidson et al. | |
| 2009/0248424 A1 | 10/2009 | Koishida et al. | |
| 2009/0254352 A1 | 10/2009 | Zhao | |
| 2010/0010810 A1 | 1/2010 | Morii | |
| 2010/0070270 A1 | 3/2010 | Gao | |
| 2010/0094637 A1 | 4/2010 | Stuart | |
| 2010/0115370 A1 | 5/2010 | Sakari et al. | |
| 2010/0198588 A1 | 8/2010 | Osada et al. | |
| 2010/0223061 A1 | 9/2010 | Ojanpera | |
| 2010/0312552 A1 | 12/2010 | Kandhadai et al. | |
| 2010/0312553 A1 | 12/2010 | Fang et al. | |
| 2010/0324912 A1 | 12/2010 | Mi et al. | |
| 2011/0015768 A1 | 1/2011 | Soo et al. | |
| 2011/0022924 A1 | 1/2011 | Malenovsky et al. | |
| 2011/0035212 A1 | 2/2011 | Briand et al. | |
| 2011/0060597 A1 | 3/2011 | Wei-Ge et al. | |
| 2011/0071839 A1 | 3/2011 | Budnikov et al. | |
| 2011/0095920 A1 | 4/2011 | Ashley et al. | |
| 2011/0096830 A1 | 4/2011 | Ashley et al. | |
| 2011/0116542 A1 | 5/2011 | Marc et al. | |
| 2011/0125505 A1 | 5/2011 | Philleppe et al. | |
| 2011/0145003 A1 | 6/2011 | Bruno | |
| 2011/0196673 A1 | 8/2011 | Jin et al. | |
| 2011/0200198 A1 | 8/2011 | Stefan et al. | |
| 2011/0238425 A1 | 9/2011 | Jeremie et al. | |
| 2011/0238426 A1 | 9/2011 | Borsum et al. | |
| 2012/0010879 A1 | 1/2012 | Kei et al. | |
| 2012/0022881 A1 | 1/2012 | Geiger et al. | |
| 2012/0072209 A1* | 3/2012 | Krishnan | G10L 25/90 704/207 |
| 2012/0109659 A1 | 5/2012 | Guoming et al. | |
| 2012/0214544 A1 | 8/2012 | Rodriguez et al. | |
| 2012/0245947 A1 | 9/2012 | Neuendorf et al. | |
| 2012/0265540 A1 | 10/2012 | Fuchs et al. | |
| 2012/0265541 A1 | 10/2012 | Geiger et al. | |
| 2013/0030819 A1 | 1/2013 | Pontus et al. | |
| 2013/0096912 A1 | 4/2013 | Resch et al. | |
| 2013/0226594 A1 | 8/2013 | Fuchs et al. | |
| 2013/0282369 A1 | 10/2013 | Sang-Ut et al. | |
| 2014/0052439 A1 | 2/2014 | Tejaswi et al. | |
| 2014/0067404 A1 | 3/2014 | Baumgarte | |
| 2014/0074486 A1 | 3/2014 | Dietz et al. | |
| 2014/0108020 A1 | 4/2014 | Yang et al. | |
| 2014/0142957 A1 | 5/2014 | Nam-Suk et al. | |
| 2014/0172141 A1 | 6/2014 | Mangold | |
| 2014/0223029 A1 | 8/2014 | Bhaskar et al. | |
| 2014/0358531 A1 | 12/2014 | Vos | |
| 2015/0010155 A1 | 1/2015 | Yue et al. | |
| 2015/0081312 A1 | 3/2015 | Fuchs et al. | |
| 2015/0142452 A1 | 5/2015 | Nam-Suk et al. | |
| 2015/0154969 A1 | 6/2015 | Craven et al. | |
| 2015/0170668 A1 | 6/2015 | Kovesi et al. | |
| 2015/0221311 A1 | 8/2015 | Jeon et al. | |
| 2015/0228287 A1 | 8/2015 | Bruhn et al. | |
| 2015/0255079 A1 | 9/2015 | Huang et al. | |
| 2015/0302859 A1 | 10/2015 | Aguilar et al. | |
| 2015/0302861 A1 | 10/2015 | Salami et al. | |
| 2015/0325246 A1 | 11/2015 | Philip et al. | |
| 2015/0371647 A1 | 12/2015 | Faure et al. | |
| 2016/0019898 A1 | 1/2016 | Schreiner et al. | |
| 2016/0027450 A1 | 1/2016 | Gao | |
| 2016/0078878 A1* | 3/2016 | Ravelli | G10L 19/032 704/501 |
| 2016/0111094 A1 | 4/2016 | Martin et al. | |
| 2016/0189721 A1 | 6/2016 | Johnston et al. | |
| 2016/0225384 A1 | 8/2016 | Kjörling et al. | |
| 2016/0285718 A1 | 9/2016 | Bruhn | |
| 2016/0293174 A1 | 10/2016 | Atti et al. | |
| 2016/0293175 A1 | 10/2016 | Atti et al. | |
| 2016/0307576 A1 | 10/2016 | Doehla et al. | |
| 2016/0365097 A1 | 12/2016 | Guan et al. | |
| 2016/0372125 A1 | 12/2016 | Atti et al. | |
| 2016/0372126 A1 | 12/2016 | Atti et al. | |
| 2016/0379655 A1 | 12/2016 | Truman et al. | |
| 2017/0011747 A1 | 1/2017 | Faure et al. | |
| 2017/0053658 A1 | 2/2017 | Atti et al. | |
| 2017/0078794 A1 | 3/2017 | Bongiovi et al. | |
| 2017/0294196 A1 | 3/2017 | Bradley et al. | |
| 2017/0103769 A1 | 4/2017 | Laaksonen et al. | |

(56) References Cited

U.S. PATENT DOCUMENTS

| | | | |
|---|---|---|---|
| 2017/0110135 A1 | 4/2017 | Disch et al. | |
| 2017/0133029 A1 | 5/2017 | Markovic et al. | |
| 2017/0140769 A1* | 5/2017 | Ravelli | G10L 19/025 |
| 2017/0154631 A1 | 6/2017 | Stefan et al. | |
| 2017/0154635 A1 | 6/2017 | Doehla et al. | |
| 2017/0221495 A1 | 8/2017 | Sung et al. | |
| 2017/0236521 A1 | 8/2017 | Venkatraman et al. | |
| 2017/0249387 A1 | 8/2017 | Hatami-Hanza | |
| 2017/0256266 A1 | 9/2017 | Sung et al. | |
| 2017/0303114 A1 | 10/2017 | Johansson et al. | |
| 2019/0027156 A1 | 1/2019 | Sung et al. | |

FOREIGN PATENT DOCUMENTS

| | | |
|---|---|---|
| CN | 107103908 A | 8/2017 |
| EP | 0716787 A1 | 6/1996 |
| EP | 0732687 B2 | 9/1996 |
| EP | 1791115 A2 | 5/2007 |
| EP | 2676266 B1 | 12/2013 |
| EP | 2980796 A1 | 2/2016 |
| EP | 2980799 A1 | 2/2016 |
| EP | 3111624 A1 | 1/2017 |
| FR | 2944664 A1 | 10/2010 |
| JP | H05-281996 A | 10/1993 |
| JP | H07-28499 A | 1/1995 |
| JP | H0811644 A | 1/1996 |
| JP | H9-204197 A | 8/1997 |
| JP | H10-51313 A | 2/1998 |
| JP | H1091194 A | 4/1998 |
| JP | H11-330977 A | 11/1999 |
| JP | 2004-138756 A | 5/2004 |
| JP | 2006-527864 A | 12/2006 |
| JP | 2007519014 A | 7/2007 |
| JP | 2007-525718 A | 9/2007 |
| JP | 2009-003387 A | 1/2009 |
| JP | 2009-008836 A | 1/2009 |
| JP | 2009-538460 A | 11/2009 |
| JP | 2010-500631 A | 1/2010 |
| JP | 2010-501955 A | 1/2010 |
| JP | 2012-533094 A | 12/2012 |
| JP | 2016-523380 A | 8/2016 |
| JP | 2016-200750 A | 12/2016 |
| JP | 2017-522604 A | 8/2017 |
| JP | 2017-528752 A | 9/2017 |
| KR | 100261253 B1 | 7/2000 |
| KR | 20030031936 A | 4/2003 |
| KR | 1020050007853 A | 1/2005 |
| KR | 1020090077951 A | 7/2009 |
| KR | 10-2010-0136890 A | 12/2010 |
| KR | 20130019004 A | 2/2013 |
| KR | 1020160144978 A | 12/2016 |
| KR | 20170000933 A | 1/2017 |
| RU | 2337414 C2 | 10/2008 |
| RU | 2376657 C2 | 12/2009 |
| RU | 2413312 C2 | 2/2011 |
| RU | 2419891 C2 | 5/2011 |
| RU | 2439718 C1 | 1/2012 |
| RU | 2483365 C2 | 5/2013 |
| RU | 2520402 C2 | 6/2014 |
| RU | 2568381 C2 | 11/2015 |
| RU | 2596594 C2 | 9/2016 |
| RU | 2596596 C2 | 9/2016 |
| RU | 2015136540 A | 3/2017 |
| RU | 2628162 C2 | 8/2017 |
| RU | 2016105619 A | 8/2017 |
| TW | 200809770 A | 2/2008 |
| TW | 201005730 A | 2/2010 |
| TW | 201126510 A | 8/2011 |
| TW | 201131550 A | 9/2011 |
| TW | 201207839 A | 2/2012 |
| TW | 201243832 A | 11/2012 |
| TW | 201612896 A | 4/2016 |
| TW | 201618080 A | 5/2016 |
| TW | 201618086 A | 5/2016 |
| TW | 201642246 A | 12/2016 |
| TW | 201642247 A | 12/2016 |
| TW | 201705126 A | 2/2017 |
| TW | 201711021 A | 3/2017 |
| TW | 201713061 A | 4/2017 |
| TW | 201724085 A | 7/2017 |
| TW | 201732779 A | 9/2017 |
| WO | 9916050 A1 | 4/1999 |
| WO | 2004/072951 A1 | 8/2004 |
| WO | 2005/086138 A1 | 9/2005 |
| WO | 2005/086139 A1 | 9/2005 |
| WO | 2007/073604 A1 | 7/2007 |
| WO | 2007/138511 A1 | 12/2007 |
| WO | 2008/025918 A1 | 3/2008 |
| WO | 2008/046505 A1 | 4/2008 |
| WO | 2009/066869 A1 | 5/2009 |
| WO | 2011/048118 A1 | 4/2011 |
| WO | 2011/086066 A1 | 7/2011 |
| WO | 2011/086067 A1 | 7/2011 |
| WO | 2012/000882 A | 1/2012 |
| WO | 2012/000882 A1 | 1/2012 |
| WO | 2012/126893 A | 9/2012 |
| WO | 2014/072951 A1 | 5/2014 |
| WO | 2014/165668 A | 10/2014 |
| WO | 2014/202535 A | 12/2014 |
| WO | 2014/202535 A1 | 12/2014 |
| WO | 2015/063045 A1 | 5/2015 |
| WO | 2015/063227 A1 | 5/2015 |
| WO | 2015/071173 A1 | 5/2015 |
| WO | 2015/174911 A1 | 11/2015 |
| WO | 2016/016121 A1 | 2/2016 |
| WO | 2016/142002 A1 | 9/2016 |
| WO | 2016/142337 A1 | 9/2016 |

OTHER PUBLICATIONS

ITU-T G.718: Frame error robust narrow-band and wideband embedded variable bitrate coding of speech and audio from 8-32 kbit/s.

Alain De Cheveigńeet al.: "YIN, a fundamental frequency estimator for speech and music." The Journal of the Acoustical Society of America 111.4 (2002): 1917-1930.

3GPP TS 26.190; Speech codec speech processing functions; Adaptive Multi-Rate -Wideband (AMR-WB) speech codec; Transcoding functions.

"5 Functional description of the encoder"; 3GPP Standard; 26445-C10 1 S05 S0501, 3rd Generation Partnership PROJECT-(3GPP)?, Mobile Competence Centre; 650, Route Des Lucioles; F-06921 Sophiaantipoli S Cedex; France; Dec. 10, 2014 (Dec. 10, 2014), XP050907035, Retrieved from the Internet: URL:http://www.3gpp.org/ftp/Specs/2014-12/Rel-12/26 series/ [retrieved on Dec. 10, 2014].

Ojala P et al: "A novel pitch-lag search method using adaptive weighting and median filtering"; Speech Coding Proceedings, 1999 IEEE Workshop on PORVOO, Finland Jun. 20-23, 1999, Piscataway, NJ, USA, IEEE, US, Jun. 20, 1999 (Jun. 20, 1999), pp. 114-116, XP010345546.

3GPP TS 26.445; Codec for Enhanced Voice Services (EVS); Detailed algorithmic description.

ISO/IEC 23008-3:2015; Information technology—High efficiency coding and mediadelivery in heterogeneous environments—Part 3: 3D audio.

O.E. Groshev, "Office Action for RU Application No. 2020118947", dated Dec. 1, 2020, ROSPATENT, Russia.

O.I. Starukhina, "Office Action for RU Application No. 2020118968", dated Dec. 23, 2020, ROSPATENT, Russia.

P.A. Volkov, "Office Action for RU Application No. 2020120251", dated Oct. 28, 2020, ROSPATENT, Russia.

P.A. Volkov, "Office Action for RU Application No. 2020120256", dated Oct. 28, 2020, ROSPATENT, Russia.

D.V.TRAVNIKOV, "Decision on Grant for RU Application No. 2020118969", dated Nov. 2, 2020, ROSPATENT, Russia.

Hiroshi Ono, "Office Action for JP Application No. 2020-526081", dated Jun. 22, 2021, JPO, Japan.

Hiroshi Ono, "Office Action for JP Application No. 2020-526084", dated Jun. 23, 2021, JPO, Japan.

ETSI TS 126 445 V13.2.0 (Aug. 2016), Universal Mobile Telecommunications System (UMTS); LTE; Codec for Enhanced Voice

(56) References Cited

OTHER PUBLICATIONS

Services (EVS); Detailed algorithmic description (3GPP TS 26.445 version 13.2.0 Release 13) [Online]. Available: http://www.3gpp.org/ftp/Specs/archive/26_series/26.445/26445-d00.zip.
Geiger, "Audio Coding based on integer transform", Ilmenau: https://www.db-thueringen.de/receive/dbt_mods_00010054, 2004.
Henrique S Malvar, "Biorthogonal and Nonuniform Lapped Transforms for Transform Coding with Reduced Blocking and Ringing Artifacts", IEEE Transactions on Signal Processing, IEEE Service Center, New York, NY, US, (Apr. 1998), vol. 46, No. 4, ISSN 1053-587X, XP011058114.
Anonymous, "ISO/IEC 14496-3:2005/FDAM 9, AAC-ELD", 82. MPEG MEETING;Oct. 22, 2007-Oct. 26, 2007; Shenzhen; (Motion Picture Expert Group or ISO/IEC JTC1/SC29/WG11)., (Feb. 21, 2008), No. N9499, XP030015994.
Virette, "Low Delay Transform for High Quality Low Delay Audio Coding", Universite de Rennes 1, (Dec. 10, 2012), pp. 1-195, URL: https://hal.inria.fr/tel-01205574/document, (Mar. 30, 2016), XP055261425.
ISO/IEC 14496-3:2001; Information technology—Coding of audio-visual objects—Part 3: Audio.
3GPP TS 26.403 v14.0.0 (Mar. 2017); General audio codec audio processing functions; Enhanced acPlus general audio codec; Encoder specification; Advanced Audio Coding (AAC) part; (Release 14).
ISO/IEC 23003-3; Information technology—MPEG audio technologies—Part 3: Unified speech and audio coding, 2011.
3GPP TS 26.445 V14.1.0 (Jun. 2017), 3rd Generation Partnership Project; Technical Specification Group Services and System Aspects; Codec for Enhanced Voice Services (EVS); Detailed Algorithmic Description (Release 14), http://www.3gpp.org/ftp//Specs/archive/26_series/26.445/26445-e10.zip, Section 5.1.6 "Bandwidth detection".
Eksler Vaclav et al., "Audio bandwidth detection in the EVS codec", 2015 IEEE Global Conference on Signal and Information Processing (GLOBALSIP), IEEE, (Dec. 14, 2015), doi:10.1109/GLOBALSIP.2015.7418243, pp. 488-492, XP032871707.
Oger M et al, "Transform Audio Coding with Arithmetic-Coded Scalar Quantization and Model-Based Bit Allocation", International Conference on Acoustics, Speech, and Signalprocessing, IEEE, XX, Apr. 15, 2007 (Apr. 15, 2007), p. IV-545, XP002464925.
Asad et al., "An enhanced least significant bit modification technique for audio steganography", International Conference on Computer Networks and Information Technology, Jul. 11-13, 2011.
Makandar et al, "Least Significant Bit Coding Analysis for Audio Steganography", Journal of Future Generation Computing, vol. 2, No. 3, Mar. 2018.
ITU-T G.718 (Jun. 2008): Series G: Transmission Systems and Media, Digital Systems and Networks, Digital terminal equipments—Coding of voice and audio signals, Frame error robust narrow-band and wideband embedded variable bit-rate coding of speech and audio from 8-32 kbit/s.
3GPP TS 26.447 V14.1.0 (Jun. 2017), Technical Specification, 3rd Generation Partnership Project; Technical Specification Group Services and System Aspects; Codec for Enhanced Voice Services (EVS); Error Concealment of Lost Packets (Release 14).
DVB Organization, "ISO-IEC_23008-3_A3_(E)_(H 3DA FDAM3).docx", DVB, Digital Video Broadcasting, C/O EBU—17A Ancienne Route-CH-1218 Grand Saconnex, Geneva—SWITZERLAND, (Jun. 13, 2016), XP017851888.
Hill et al., "Exponential stability of time-varying linear systems," IMA J Numer Anal, pp. 865-885, 2011.
3GPP TS 26.090 V14.0.0 (Mar. 2017), 3rd Generation Partnership Project; Technical Specification Group Services and System Aspects; Mandatory Speech Codec speech processing functions; Adaptive Multi-Rate (AMR) speech codec; Transcoding functions (Release 14).
3GPP TS 26.190 V14.0.0 (Mar. 2017), Technical Specification, 3rd Generation Partnership Project; Technical Specification Group Services and System Aspects; Speech codec speech processing functions; Adaptive Multi-Rate-Wideband (AMR-WB) speech codec; Transcoding functions (Release 14).
3GPP TS 26.290 V14.0.0 (Mar. 2017), Technical Specification, 3rd Generation Partnership Project; Technical Specification Group Services and System Aspects; Audio codec processing functions; Extended Adaptive Multi-Rate-Wideband (AMR-WB+) codec; Transcoding functions (Release 14).
Edler et al., "Perceptual Audio Coding Using a Time-Varying Linear Pre-and Post-Filter," in AES 109th Convention, Los Angeles, 2000.
Cray et al., "Digital lattice and ladder filter synthesis," IEEE Transactions on Audio and Electroacoustics, vol. vol. 21, No. No. 6, pp. 491-500, 1973.
Lamoureux et al., "Stability of time variant filters," CREWES Research Report—vol. 19, 2007.
Herre et al., "Enhancing the performance of perceptual audio coders by using temporal noise shaping (TNS)." Audio Engineering Society Convention 101. Audio Engineering Society, 1996.
Herre et al., "Continuously signal-adaptive filterbank for high-quality perceptual audio coding." Applications of Signal Processing to Audio and Acoustics, 1997. 1997 IEEE ASSP Workshop on. IEEE, 1997.
Herre, "Temporal noise shaping, quantization and coding methods in perceptual audio coding: A tutorial introduction." Audio Engineering Society Conference: 17th International Conference: High-Quality Audio Coding. Audio Engineering Society, 1999.
Fuchs Guillaume et al, "Low delay LPC and MDCT-based audio coding in the EVS codec", 2015 IEEE International Conference on Acoustics, Speech and Signal Processing (ICASSP), IEEE, (Apr. 19, 2015), doi: 10.1109/ICASSP.2015.7179068, pp. 5723-5727, XP033187858.
Niamut et al., "RD Optimal Temporal Noise Shaping for Transform Audio Coding", Acoustics, Speech and Signal Processing, 2006. ICASSP 2006 Proceedings. 2006 IEEE International Conference on Toulouse, France May 14-19, 2006, Piscataway, NJ, USA,IEEE, Piscataway, NJ, USA, (Jan. 1, 2006), doi:10.1109/ICASSP.2006.1661244, ISBN 978-1-4244-0469-8, pp. V-V, XP031015996.
ITU-T G.711 (Sep. 1999): Series G: Transmission Systems and Media, Digital Systems and Networks, Digital transmission systems—Terminal equipments—Coding of analogue signals by pulse code modulation, Pulse code modulation (PCM) of voice frequencies, Appendix I: A high quality low-complexity algorithm for packet loss concealment with G.711.
Cheveigne et al.,"YIN, a fundamental frequency estimator for speech and music." The Journal of the Acoustical Society of America 111.4 (2002): 1917-1930.
Ojala P et al, "A novel pitch-lag search method using adaptive weighting and median filtering", Speech Coding Proceedings, 1999 IEEE Workshop on Porvoo, Finland Jun. 20-23, 1999, Piscataway, NJ, USA, IEEE, US, (Jun. 20, 1999), doi:10.1109/SCFT.1999.781502, ISBN 978-0-7803-5651-1, pp. 114-116, XP010345546.
"5 Functional description of the encoder", Dec. 10, 2014 (Dec. 10, 2014), 3GPP Standard; 26445-C10_1_S05_S0501, 3rd Generation Partnership Project (3GPP)?, Mobile Compeience Centre; 650, Route Des Lucioles ; F-06921 Sophia-Antipolis Cedex ; France Retrieved from the Internet:URL: http://www.3gpp.org/ftp/Specs/2014-12/Rel-12/26_series/ XP050907035.
Mao Xiaohong, "Examination Report for SG Application No. 11202004228V", dated Sep. 2, 2021, IPOS, Singapore.
Mao Xiaohong, "Search Report for SG Application No. 11202004228V", Sep. 3, 2021, IPOS, Singapore.
Nam Sook Lee, "Office Action for KR Application No. 10-2020-7015512", Sep. 9, 2021, KIPO, Republic of Korea.
John Tan, "Office Action for SG Application 11202004173P", Jul. 23, 2021, IPOS, Singapore.
"Decision on Grant Patent for Invention for RU Application No. 2020118949", Nov. 11, 2020, ROSPATENT, Russia.
Tetsuyuki Okumachi, "Office Action for JP Application 2020-118837", dated Jul. 16, 2021, JPO, Japan.
Tetsuyuki Okumachi, "Office Action for JP Application 2020-118838", dated Jul. 16, 2021, JPO, Japan.
Takeshi Yamashita, "Office Action for JP Application 2020-524877", dated Jun. 24, 2021, JPO, Japan.

(56) References Cited

OTHER PUBLICATIONS

Tomonori Kikuchi, "Office Action for JP Application No. 2020-524874", dated Jun. 2, 2021, JPO Japan.
Guojun Lu et al., "A Technique towards Automatic Audio Classification and Retrieval, Forth International Conference on Signal Processing", 1998, IEEE, Oct. 12, 1998, pp. 1142 to 1145.
Hiroshi Ono, "Office Action for JP Application No. 2020-526135", dated May 21, 2021, JPO Japan.
Santosh Mehtry, "Office Action for IN Application No. 202037019203", dated Mar. 19, 2021, Intellectual Property India, India.
Khalid Sayood, "Introduction to Data Compression", Elsevier Science & Technology, 2005, Section 16.4, Figure 16. 13, p. 526.
Patterson et al., "Computer Organization and Design", The hardware/software Interface, Revised Fourth Edition, Elsevier, 2012.
International Telecommunication Union, "G. 729-based embedded variable bit-rate coder: An 8-32 kbit/s scalable wideband coder bitstream interoperable with G.729". ITU-T Recommendation G.729. 1., May 2006.
3GGP TS 26.445, "Universal Mobile TElecommunications System (UMTS); LTE; Codec for Enhanced Voice Services (EVS); Detailed algorithmic description (3GPP TS 26.445 version 13.4.1 Release 13)", ETSI TS 126 445 V13.4.1., Apr. 2017.
Nam Sook Lee, "Office Action for KR Application No. 10-2020-7016100", dated Jan. 13, 2022, KIPO, Republic of Korea.
Nam Sook Lee, "Office Action for KR Application No. 10-2020-7016224", dated Jan. 13, 2022, KIPO, Republic of Korea.
Nam Sook Lee, "Office Action for KR Application No. 10-2020-7015835", dated Jan. 13, 2022, KIPO, Republic of Korea.
Kazunori Mochimura, "Decision to Grant a Patent for JP application No. 2020-524579", Nov. 29, 2021, JPO, Japan.
Dietz, Martin et al., "Overview of the EVS codec architecture." 2015 IEEE International Conference on Acoustics, Signal Processing (ICASSP), IEEE, 2015.
Nam Sook Lee, "Office Action for KR Application No. 10-2020-7016424", dated Feb. 9, 2022, KIPO, Korea.
Nam Sook Lee, "Office Action for KR Application No. 10-2020-7016503", dated Feb. 9, 2022, KIPO, Korea.
ETSI TS 126 445 V12.0.0, "Universal Mobile Telecommunications System (UMTS); LTE; EVS Codec Detailed Algorithmic Description (3GPP TS 26.445 version 12.0.0 Release 12)", Nov. 2014.
ETSI TS 126 403 V6.0.0, "Universal Mobile Telecommunications System (UMTS); General audio codec audio processing functions; Enhanced aacPlus general audio codec; Encoder specification; Advanced Audio Coding (AAC) part (3GPP TS 26.403 version 6.0.0 Release 6)", Sep. 2004.
ETSI TS 126 401 V6.2.0, "Universal Mobile Telecommunications System (UMTS); General audio codec audio processing functions; Enhanced aacPlus general audio codec; General description (3GPP TS 26.401 version 6.2.0 Release 6)", Mar. 2005.
3GPP TS 26.405, "3rd Generation Partnership Project; Technical Specification Group Services and System Aspects General audio codec audio processing functions; Enhanced aacPlus general audio codec; Encoder specification parametric stereo part (Release 6)", Sep. 2004.
3GPP TS 26.447 V12.0.0, "3rd Generation Partnership Project; Technical Specification Group Services and System Aspects; Codec for Enhanced Voice Services (EVS); Error Concealment of Lost Packets (Release 12)", Sep. 2014.
ISO/IEC FDIS 23003-3:2011(E), "Information technology—MPEG audio technologies—Part 3: Unified speech and audio coding", ISO/IEC JTC 1/SC 29/WG 11, Sep. 20, 2011.
Valin et al., "Definition of the Opus Audio Codec", Internet Engineering Task Force (IETF) RFC 6716, Sep. 2012.
Nam Sook Lee, "Decision to Grant a Patent for KR Application No. 10-2020-7015511", dated Apr. 19, 2022, KIPO, Republic of Korea.
Nam Sook Lee, "Decision to Grant a Patent for KR Application No. 10-2020-7016100", dated Apr. 21, 2022, KIPO, Republic of Korea.
Nam Sook Lee, "Decision to Grant a Patent for KR Application No. 10-2020-7015836", dated Apr. 28, 2022, KIPO, Republic of Korea.
Nam Sook Lee, "Decision to Grant a Patent for KR Application No. 10-2020-7015512", dated Apr. 20, 2022, KIPO, Republic of Korea.
Nam Sook Lee, "Decision to Grant a Patent for KR Application No. 10-2020-7015835", dated Apr. 22, 2022, KIPO, Republic of Korea.
Xiong-Malvar, "A Nonuniform Modulated Complex Lapped Transform", IEEE Signal Processing Letters, vol. 8, No. 9, Sep. 2001. (Year: 2001).
Raj et al., "An Overview of MDCT for Time Domain Aliasing Cancellation", 2014 International Conference on Communication and Network Technologies (ICCNT). (Year: 2014).
Malvar, "Biorthogonal and Nonuniform Lapped Transforms for Transform Coding with Reduced Blocking and Ringing Artifacts", IEEE Transactions on Signal Processing, vol. 46, No. 4, Apr. 1998. (Year: 1998).
Malvar, "Lapped Transforms for Efficient Transform/Subband Coding", IEEE Transactions on Acoustics, Speech, and Signal Processing, vol. 38, No. 6, Jun. 1990. (Year: 1990).
Malvar, "Fast Algorithms for Orthogonal and Biorthogonal Modulated Lapped Transforms", Microsoft Research, 1998. (Year: 1998).
Princen-Bradley, "Analysis/Synthesis Filter Bank Design Based on Time Domain Aliasing Cancellation", IEEE Transactions on Acoustics, Speech, and Signal Processing, vol. ASSP-34, No. 5, Oct. 1986. (Year: 1986).
Shlien, "The Modulated Lapped Transform, Its Time-Varying Forms, and Its Applications to Audio Coding Standards", IEEE Transactions on Speech and Audio Processing, vol. 5, No. 4, Jul. 1997. (Year: 1997).

* cited by examiner

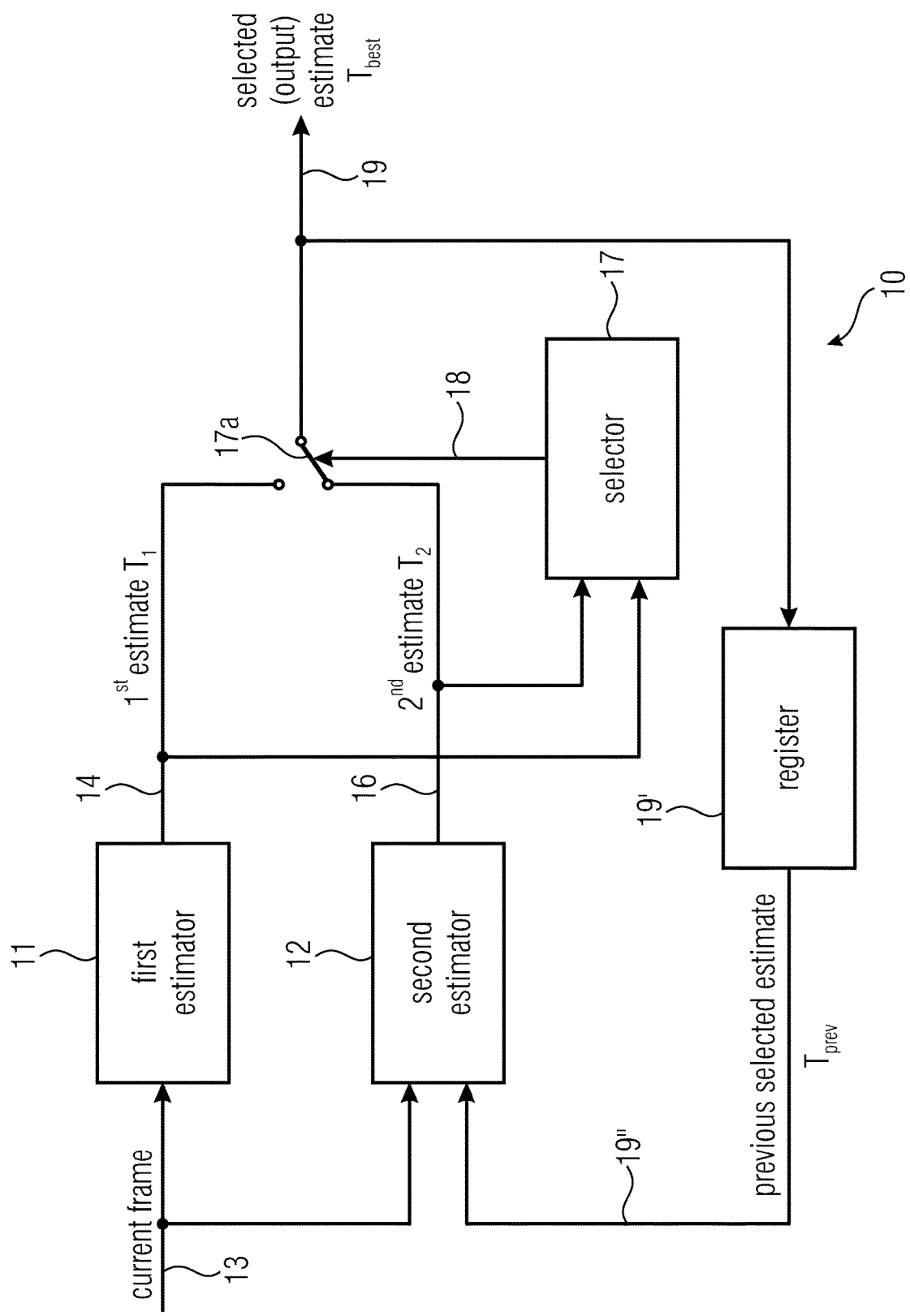

US 11,380,341 B2

SELECTING PITCH LAG

CROSS-REFERENCE TO RELATED APPLICATIONS

This application is a continuation of copending International Application No. PCT/EP2018/080195, filed Nov. 5, 2018, which is incorporated herein by reference in its entirety, and additionally claims priority from European Application No. EP 17201091.0, filed Nov. 10, 2017, which is also incorporated herein by reference in its entirety.

Examples of methods and apparatus are here provided which are capable of performing a low complexity pitch detection procedure, e.g., for long term postfiltering, LTPF, encoding.

For example, examples are capable of selecting a pitch lag for an information signal, e.g. audio signal, e.g., for performing LTPF.

1. BACKGROUND OF THE INVENTION

Transform-based audio codecs generally introduce inter-harmonic noise when processing harmonic audio signals, particularly at low delay and low bitrate. This inter-harmonic noise is generally perceived as a very annoying artefact, significantly reducing the performance of the transform-based audio codec when subjectively evaluated on highly tonal audio material.

Long Term Post Filtering (LTPF) is a tool for transform-based audio coding that helps at reducing this inter-harmonic noise. It relies on a post-filter that is applied on the time-domain signal after transform decoding. This post-filter is essentially an infinite impulse response (IIR) filter with a comb-like frequency response controlled by two parameters: a pitch lag and a gain.

For better robustness, the post-filter parameters (a pitch lag and/or a gain per frame) are estimated at the encoder-side and encoded in a bitstream when the gain is non-zero. The case of the zero gain is signalled with one bit and corresponds to an inactive post-filter, used when the signal does not contain a harmonic part.

LTPF was first introduced in the 3GPP EVS standard [1] and later integrated to the MPEG-H 3D-audio standard [2]. Corresponding patents are [3] and [4].

A pitch detection algorithm estimates one pitch lag per frame. It is usually performed at a low sampling rate (e.g. 6.4 kHz) in order to reduce the complexity. It should ideally provide an accurate, stable and continuous estimation.

When used for LTPF encoding, it is most important to have a continuous pitch contour, otherwise some instability artefacts could be heard in the LTPF filtered output signal. Not having a true fundamental frequency F0 (for example by having a multiple of it) is of less importance, because it does not result in severe artefacts but instead results in a slight degradation of the LTPF performance.

Another important characteristic of a pitch detection algorithm is its computational complexity. When implemented in an audio codec targeting low power devices or even ultra-low power devices, its computational complexity should be as low as possible.

There is an example of a LTPF encoder that can be found in the public domain. It is described in the 3GPP EVS standard [1]. This implementation is using a pitch detection algorithm described in Sec. 5.1.10 of the standard specifications. This pitch detection algorithm has a good performance and works nicely with LTPF because it gives a very stable and continuous pitch contour. Its main drawback is however its relatively high complexity.

Even though they were never used for LTPF encoding, other existing pitch detection algorithms could in theory be used for LTPF. One example is YIN [6], a pitch detection algorithm often recognized as one of the most accurate. YIN is however very complex, even significantly more than the one in [1].

Another example worth mentioning is the pitch detection algorithm used in the 3GPP AMR-WB standard [7], which has a significantly lower complexity than the one in [1], but also worse performance, it particularly gives a less stable and continuous pitch contour. Conventional technology comprises the following disclosures:

[1] 3GPP TS 26.445; Codec for Enhanced Voice Services (EVS); Detailed algorithmic description.
[2] ISO/IEC 23008-3:2015; Information technology—High efficiency coding and media delivery in heterogeneous environments—Part 3: 3D audio.
[3] Ravelli et al. "Apparatus and method for processing an audio signal using a harmonic post-filter." U.S. Patent Application No. 2017/0140769 A1. 18 May 2017.
[4] Markovic et al. "Harmonicity-dependent controlling of a harmonic filter tool." U.S. Patent Application No. 2017/0133029 A1. 11 May 2017.
[5] ITU-T G.718: Frame error robust narrow-band and wideband embedded variable bit-rate coding of speech and audio from 8-32 kbit/s.
[6] De Cheveigné, Alain, and Hideki Kawahara. "YIN, a fundamental frequency estimator for speech and music." The Journal of the Acoustical Society of America 111.4 (2002): 1917-1930.
[7] 3GPP TS 26.190; Speech codec speech processing functions; Adaptive Multi-Rate-Wideband (AMR-WB) speech codec; Transcoding functions.

There are some cases, however, for which the pitch lag estimation should be ameliorated. Current low complexity pitch detection algorithms (like the one in [7]) have a performance which is not satisfactory for LTPF, particularly for complex signals, like polyphonic music. The pitch contour can be very unstable, even during stationary tones. This is due to jumps between the local maxima of the weighted autocorrelation function.

Therefore, there is the need of obtaining pitch lag estimations which better adapt to complex signals, with the same or lower complexity than conventional technology.

2. SUMMARY

According to an embodiment, an apparatus for encoding an information signal including a plurality of frames may have: a first estimator configured to obtain a first estimate, the first estimate being an estimate of a pitch lag for a current frame, wherein the first estimate is obtained as the lag that maximizes a first correlation function associated to the current frame; a second estimator configured to obtain a second estimate, the second estimate being another estimate of a pitch lag for the current frame, wherein the second estimator is conditioned by the pitch lag selected at the previous frame so as to obtain the second estimate for the current frame, wherein the second estimator is configured to obtain the second estimate by searching the lag which maximizes a second correlation function in a second subinterval which contains the pitch lag selected for the previous frame, a selector configured to choose a selected value by performing a selection between the first estimate and the second estimate on the basis of a first and a second correlation measurements, wherein the selector is configured to perform a comparison between: a downscaled version of a first normalized autocorrelation measurement associated to the current frame and obtained at a lag corresponding to the first estimate; and a second normalized autocorrelation measurement associated to the current frame and obtained at a lag corresponding to the second estimate, so as to select the first estimate when the second normalized autocorrelation measurement is less than the downscaled version of the first normalized autocorrelation measurement, and/or to select the second estimate when the second normalized autocorrelation measurement is greater than the downscaled version of the first normalized autocorrelation measurement.

According to another embodiment, a system may have an encoder side and a decoder side, the encoder side including the inventive apparatus, the decoder side including a long term postfiltering tool controlled on the basis of the pitch lag estimate selected by the selector.

According to another embodiment, a method for determining a pitch lag for a signal divided into frames may have the steps of: performing a first estimation for a current frame to obtain first estimate as the lag that maximizes a first correlation function associated to the current frame; performing a second estimation for the current frame obtained by searching for the lag which maximizes a second correlation function in a second subinterval which contains the pitch lag selected for the previous frame, wherein performing the second estimation is obtained on the basis of the result of a selecting step performed at the previous frame; and selecting between the first estimate obtained at the first estimation and the second estimate obtained at the second estimation on the basis of a first and a second normalized autocorrelation measurements, wherein selecting includes performing a comparison between: a downscaled version of the first normalized autocorrelation measurement, associated to the current frame and obtained at a lag corresponding to the first estimate; the second normalized autocorrelation measurement, associated to the current frame and obtained at a lag corresponding to the second estimate; and selecting the first estimate when the second normalized autocorrelation measurement is less than the downscaled version of the first normalized autocorrelation measurement, and/or selecting the second estimate when the second normalized autocorrelation measurement is greater than the downscaled version of the first normalized autocorrelation measurement.

According to another embodiment, a method for encoding a bitstream for a signal divided into frames may have the steps of: performing the inventive method for determining a pitch lag; and encoding data useful for performing LTPF at the decoder, the data useful for performing LTPF including the selected value.

Another embodiment may have non-transitory digital storage medium having a computer program stored thereon to perform any of the inventive methods when said computer program is run by a computer.

In accordance to examples, there is provided an apparatus for encoding an information signal including a plurality of frames, the apparatus comprising:
a first estimator configured to obtain a first estimate, the first estimate being an estimate of a pitch lag for a current frame;
a second estimator configured to obtain a second estimate, the second estimate being another estimate of a pitch lag for the current frame, a selector configured to choose a selected value by performing a selection between the first estimate and the second estimate on the basis of a first and a second correlation measurements,
wherein the second estimator is conditioned by the pitch lag selected at the previous frame so as to obtain the second estimate for the current frame,
characterized in that the selector is configured to:
perform a comparison between:
  a downscaled version of a first correlation measurement associated to the current frame and obtained at a lag corresponding to the first estimate; and
  a second correlation measurement associated to the current frame and obtained at a lag corresponding to the second estimate,
so as to select the first estimate when the second correlation measurement is less than the downscaled version of the first correlation measurement, and/or
to select the second estimate when the second correlation measurement is greater than the downscaled version of the first correlation measurement,
wherein at least one of the first and second correlation measurement is an autocorrelation measurement and/or a normalized autocorrelation measurement.

In accordance to examples, there is provided an apparatus for encoding an information signal into a bitstream (63) including a plurality of frames, the apparatus (60a) comprising:
a detection unit comprising:
  a first estimator configured to obtain a first estimate, the first estimate being an estimate of a pitch lag for a current frame;
  a second estimator configured to obtain a second estimate, the second estimate being another estimate of a pitch lag for the current frame, wherein the second estimator is conditioned by the pitch lag selected at the previous frame so as to obtain the second estimate for the current frame;
  a selector configured to choose a selected value by performing a selection between the first estimate and the second estimate on the basis of at least one correlation measurement, wherein the selector is configured to perform a comparison between:
    a second correlation measurement associated to the current frame and obtained at a lag corresponding to the second estimate; and
    a pitch lag selection threshold,
  so as to select the second estimate when the second correlation measurement is greater than the pitch lag selection threshold; and/or
  to select the first estimate when the second correlation measurement is lower than the pitch lag selection threshold; and
a long-term post filtering, LTPF, tool configured to encode data useful for performing LTPF at the decoder, the data useful for performing LTPF including the selected value.

In accordance to examples, there is provided an apparatus for encoding an information signal including a plurality of frames, the apparatus comprising:
a first estimator configured to obtain a first estimate, the first estimate being an estimate of a pitch lag for a current frame;
a second estimator configured to obtain a second estimate, the second estimate being another estimate of a pitch lag for the current frame, a selector configured to choose a selected value by performing a selection between the first estimate and the second estimate on the basis of at least one correlation measurement, wherein the second estimator is conditioned by the pitch lag selected at the previous frame so as to obtain the second estimate for the current frame.

In accordance to examples, the selector is configured to perform a comparison between:
- a second correlation measurement associated to the current frame and obtained at a lag corresponding to the second estimate; and
- a pitch lag selection threshold, so as to select the second estimate when the second correlation measurement is greater than the pitch lag selection threshold; and/or to select the first estimate when the second correlation measurement is lower than the pitch lag selection threshold.

In accordance to examples, the selector is configured to perform a comparison between:
- a first correlation measurement associated to the current frame and obtained at a lag corresponding to the first estimate; and
- a second correlation measurement associated to the current frame and obtained at a lag corresponding to the second estimate, so as to select the first estimate when the first correlation measurement is at least greater than the second correlation measurement, and/or to select the second estimate when the first correlation measurement is at least lower than the second correlation measurement.

In accordance to examples, the selector is configured to: perform a comparison between:
- a downscaled version of a first correlation measurement associated to the current frame and obtained at a lag corresponding to the first estimate; and
- a second correlation measurement associated to the current frame and obtained at a lag corresponding to the second estimate, so as to select the first estimate when the second correlation measurement is less than the downscaled version of the first correlation measurement, and/or to select the second estimate when the second correlation measurement is greater than the downscaled version of the first correlation measurement.

In accordance to examples, at least one of the first and second correlation measurement is an autocorrelation measurement and/or a normalized autocorrelation measurement.

A transform coder to generate a representation of the information signal or a processed version thereof may be implemented.

In accordance to examples, the second estimator is configured to:
obtain the second estimate by searching the lag which maximizes a second correlation function in a second subinterval which contains the pitch lag selected for the previous frame.

In accordance to examples, the second subinterval contains lags within a distance less than a pre-defined lag number threshold from the pitch lag selected for the previous frame.

In accordance to examples, the second estimator is configured to:
search for a maximum value among the second correlation function values to associate the second estimate to the lag associated to the maximum value among the second correlation function values.

In accordance to examples, the first estimator is configured to:
obtain the first estimate as the lag that maximizes a first correlation function associated to the current frame.

In accordance to examples, the first correlation function is restricted to lags in a first subinterval.

In accordance to examples, the first subinterval contains a number of lags greater than the second subinterval, and/or at least some of the lags in the second subinterval are comprised in the first subinterval.

In accordance to examples, the first estimator) is configured to:
weight the correlation measurement values of the first correlation function using a monotonically decreasing weight function before searching for the lag that maximizes the first correlation function.

In accordance to examples, at least one of the second and first correlation function is an autocorrelation function and/or a normalized autocorrelation function.

In accordance to examples, the first estimator is configured to obtain the first estimate $T_1$ by performing at least some of the following operations:

$$T_1 = \underset{k=k_{min} \cdots k_{max}}{\operatorname{argmax}} R_w(k)$$

$$R_w(k) = R(k)w(k) \text{ for } k = k_{min} \cdots k_{max}$$

$$w(k) = 1 - 0.5\frac{(k - k_{min})}{(k_{max} - k_{min})} \text{ for } k = k_{min} \cdots k_{max}$$

$$R(k) = \sum_{n=0}^{N-1} x(n)x(n-k) \text{ for } k = k_{min} \cdots k_{max}$$

w(k) being a weighting function, $k_{min}$ and $k_{max}$ being associated to a minimum lag and a maximum lag, R being an autocorrelation measurement value estimated on the basis of the information signal or a processed version thereof and N being the frame length.

In accordance to examples, the second estimator is configured to obtain the second estimate $T_2$ by performing:

$$T_2 = \underset{k=k'_{min} \cdots k'_{max}}{\operatorname{argmax}} R(k)$$

with $k'_{min}=\max(k_{min}, T_{prev}-\delta)$, $k'_{max}=\min(k_{max}, T_{prev}+\delta)$, $T_{prev}$ being the selected estimate in the preceding frame, and $\delta$ is a distance from $T_{prev}$, $k_{min}$ and $k_{max}$ being associated to a minimum lag and a maximum lag.

In accordance to examples, the selector is configured to perform a selection of the pitch lag estimate $T_{curr}$ in terms of $$T_{curr} = \begin{cases} T_1 & \text{if } normcorr(x, N, T_2) \leq \alpha normcorr(x, N, T_1) \\ T_2 & \text{otherwise} \end{cases}$$

with $T_1$ being the first estimate, $T_2$ being the second estimate, x being a value of the information signal or a processed version thereof, normcorr(x, N, T) being the normalized correlation measurement of the signal x of length N at lag T, $\alpha$ being a downscaling coefficient.

In accordance to examples, there is provided, downstream to the selector, a long term postfiltering, LTPF, tool for controlling a long term postfilter at a decoder apparatus.

In accordance to examples, the information signal is an audio signal.

In accordance to examples, the apparatus is configured to obtain the first correlation measurement as a measurement of harmonicity of the current frame and the second correlation measurement as a measurement of harmonicity of the current frame restricted to a subinterval defined for the previous frame.

In accordance to examples, the apparatus is configured to obtain the first and second correlation measurements using the same correlation function up to a weighting function.

In accordance to examples, the apparatus is configured to obtain the first correlation measurement as the normalized version of the first estimate up to a weighting function.

In accordance to examples, the apparatus is configured to obtain the second correlation measurement as the normalized version of the second estimate.

In accordance to examples, there is provided a system comprising an encoder side and a decoder side, the encoder side being as above, the decoder side comprising a long term postfiltering tool controlled on the basis of the pitch lag estimate selected by the selector.

In accordance to examples, there is provided a method for determining a pitch lag for a signal divided into frames, comprising:
  performing a first estimation for a current frame;
  performing a second estimation for the current frame; and
  selecting between the first estimate obtained at the first estimation and the second estimate obtained at the second estimation on the basis of at least one correlation measurement,
  wherein performing the second estimation is obtained on the basis of the result of a selecting step performed at the previous frame.

In accordance to examples, the method may comprise using the selected lag for long term postfiltering, LTPF.

In accordance to examples, the method may comprise using the selected lag for packet lost concealment, PLC.

In accordance to examples, there is provided a method for determining a pitch lag for a signal divided into frames, comprising:
  performing a first estimation for a current frame;
  performing a second estimation for the current frame; and
  selecting between the first estimate obtained at the first estimation and the second estimate obtained at the second estimation on the basis of correlation measurements,
  wherein performing the second estimation is obtained on the basis of the result of a selecting step performed at the previous frame,
  characterized in that selecting includes performing a comparison between:
    a downscaled version of a first correlation measurement associated to the current frame and obtained at a lag corresponding to the first estimate; and
    a second correlation measurement associated to the current frame and obtained at a lag corresponding to the second estimate; and
    selecting the first estimate when the second correlation measurement is less than the downscaled version of the first correlation measurement, and/or selecting the second estimate when the second correlation measurement is greater than the downscaled version of the first correlation measurement,
  wherein at least one of the first and second correlation measurement is an autocorrelation measurement and/or a normalized autocorrelation measurement.

In accordance to examples, there is provided a method for encoding a bitstream for a signal divided into frames, comprising:
  performing a first estimation for a current frame;
  performing a second estimation for the current frame; and
  selecting between the first estimate obtained at the first estimation and the second estimate obtained at the second estimation on the basis of at least one correlation measurement,
  wherein performing the second estimation is obtained on the basis of the result of a selecting step performed at the previous frame,
  wherein selecting includes performing a comparison between:
    a second correlation measurement associated to the current frame and obtained at a lag corresponding to the second estimate; and
    a pitch lag selection threshold,
    selecting the second estimate when the second correlation measurement is greater than the pitch lag selection threshold and/or selecting the first estimate when the second correlation measurement is lower than the pitch lag selection threshold; and
  the method further comprising encoding data useful for performing LTPF at the decoder the selected value.

In accordance to examples, there is provided a program comprising instructions which, when executed by a processor, cause the processor to perform any of the methods above or below.

3. BRIEF DESCRIPTION OF THE DRAWINGS

Embodiments of the present invention will be detailed subsequently referring to the appended drawings, in which:
  FIGS. 1a and 2 show apparatus according to examples.
  FIG. 1b shows a method according to an example.
  FIGS. 3 and 4 show methods according to examples.
  FIGS. 5 and 5a-5d show a diagrams of correlation functions.
  FIG. 6 shows a system according to the invention.
  FIGS. 7 and 8 shows apparatus according to the invention.
  FIG. 9 shows an example of operation at the decoder.

DETAILED DESCRIPTION OF THE INVENTION

5. Examples of Selections and Estimations

Examples of low-complexity pitch detection procedures, systems, and apparatus, e.g., for LTPF encoding and/or decoding, are disclosed.

An information signal may be described in the time domain, TD, as a succession of samples (e.g., x(n)) acquired at different discrete time instants (n). The TD representation may comprise a plurality of frames, each associated to a plurality of samples. The frames may be seen in a sequence one after the other one, so that a current frame is temporally before a subsequent frame and is temporally after a previous frame. It is possible to operate iteratively, so that operations performed on the previous frame are repeated for the current frame.

During an iteration associated to a current frame, it is possible to perform at least for some operations (e.g., a second estimate) which are conditioned by the selection performed at the previous iteration associated to the previous frame. Therefore, the history of the signal at the previous frame is taken into account, e.g., for selecting the pitch lag to be used by the decoder for performing long term postfiltering (LTPF).

5.1 General Structure and Function According to Examples

FIG. 1a shows a portion of an apparatus 10 for encoding an information signal. The apparatus 10 may comprise a first estimator 11 configured to perform a first estimation process to obtain a first estimate 14 ($T_1$) for a current frame 13. The apparatus 10 may comprise a second estimator 12 configured to perform a second estimation process to obtain a second estimate 16 ($T_2$) for the current frame 13). The apparatus 10 may comprise a selector 17 configured to perform a selection 18 between the first estimate 14 and the second estimate 16 on the basis of at least one correlation measurement (the element represented by the switch 17a is controlled by the element 17). An output (final) estimate 19 ($T_{best}$) is chosen between the first estimate 14 and the second estimate 16 and may be, for example, provided to a decoder, e.g., for performing LTPF. The output (final) estimate 19 will be used as the pitch lag for the LTPF.

The final estimate (selected value) 19 may also be input to a register 19' and be used, when performing an iteration on the subsequent frame, as an input 19" ($T_{prev}$) to the second estimator 12 regarding a previously operated selection. For each frame 13, the second estimator 12 obtains the second estimate 16 on the basis of the previously final estimate 19" for the previous frame.

FIG. 1b shows a method 100 (e.g., for determining a final pitch lag to be used for LPTF) for a signal divided into frames. The method comprises performing a first estimation (pitch lag estimation) for a current frame at step S101. The method comprises performing a second estimation for the current frame at step S102, the second estimation being based on the selection operated at the previous frame (e.g., the final pitch lag chosen for the LTPF at the previous frame). The method comprises selecting between the first estimate 14 and the second estimate 16 on the basis of at least one correlation measurement at step S103.

Subsequently, at step S104, the frames are updated: the frame that was the "current frame" becomes the "previous frame", while a new (subsequent) frame becomes the new "current frame". After the update, the method may be iterated.

FIG. 2 shows a portion of an apparatus 10 (which may be the same of that of FIG. 1a) for encoding an information signal. In the selector 17, a first measurer 21 may measure a first correlation (e.g., a normalized correlation) 23 associated to the current frame 13 (e.g., the normalized autocorrelation of the first estimate $T_1$). A second measurer 22 may measure a second correlation (e.g., a normalized correlation) 25 associated to the current frame 13 (e.g., the normalized autocorrelation of the second estimate $T_2$). The first normalized correlation 23 may be downscaled at scaler 26 by a predetermined value a which may be, for example, a value between 0.8 and 0.9, more in particular 0.84 and 0.86, and which may be 0.85. The second correlation (e.g., a normalized correlation) 25 associated to the current frame 13 may be compared to the scaled first correlation 24, for example (in examples, the scaler 26 is optional and the first correlation is not scaled). The selection 18 between the first estimate 14 ($T_1$) and the second estimate 16 ($T_2$) is based on the comparison performed at the comparer 27. When the second correlation 25 is greater than the scaled first correlation 24, the second estimate 16 is chosen as the pitch lag information as selected output estimate 19 ($T_{best}=T_2$) to be provided to the decoder (e.g., to be used as the pitch lag for LTPF). When the second correlation 25 is lower than the scaled first correlation 24, the first estimate 14 ($T_1$) is chosen as the pitch lag information 19 ($T_{best}=T_1$) to be provided to the decoder.

5.2 First Estimation

Operations of the first estimator 11 which may be used, in examples, for providing a first estimate 14 on the basis of the current frame 13 are here discussed. The method 30 is shown in FIG. 3.

Step 1. Resampling $1^{st}$ Stage (Step S31)

An input signal x(n) at sampling rate F is resampled to a lower sampling rate $F_1$ (e.g. $F_1$=12.8 kHz). The resampling can be implemented using e.g. a classic upsampling+low-pass+downsampling approach. The present step is optional in some examples.

Step 2. High-Pass Filtering (Step S21)

The resampled signal is then high-pass filtered using e.g. a 2-order IIR filter with 3 dB-cutoff at 50 Hz. The resulting signal is noted $x_1$(n). The present step is optional in some examples.

Step 3. Resampling $2^{nd}$ Stage (Step S33)

The signal $x_1$ (n) is further downsampled by a factor of 2 using e.g. a 4-order FIR low-pass filter followed by a decimator. The resulting signal at sampling rate $F_2=F_1/2$ (e.g. $F_2$=6.4 kHz) is noted $x_2$ (n). The present step is optional in some examples.

Step 4. Autocorrelation Computation (Step S34)

An autocorrelation process may be performed. For example, an autocorrelation may be processed on $x_2$ (n) by $$R(T) = \sum_{n=0}^{N-1} x_2(n)x_2(n-T), T = T_{min}, \ldots, T_{max}$$

with N is the frame size. $T_{min}$ and $T_{max}$ are the minimum and maximum values for retrieving the pitch lag (e.g. $T_{min}$=32 and $T_{max}$=228). $T_{min}$ and $T_{max}$ may therefore constitute the extremities of a first interval where the first estimate (pitch lag of the current frame) is to be found.

Step 5. Autocorrelation Weighting (Step S35)

The autocorrelation may be weighted in order to emphasize the lower pitch lags $$R_w(T)=R(T)w(T), T=T_{min}, \ldots, T_{max}$$

with w(T) is a decreasing function (e.g., a monotonically decreasing function), given e.g. by $$w(T) = 1 - 0.5 \frac{(T - T_{min})}{(T_{max} - T_{min})}, T = T_{min}, \ldots, T_{max}$$

Step 6. First Estimation (Step S36)

The first estimate $T_1$ is the value that maximizes the weighted autocorrelation:

$$T_1 = \underset{T=T_{min},\ldots,T_{max}}{\operatorname{argmax}} R_w(T)$$

The first estimate $T_1$ may be provided as output 14 of the first estimator 11. This may be an estimate of pitch lag for the present frame.

R (T) (or its weighted version $R_w(T)$) is an example of a first correlation function whose maximum value is associated to the first pitch lag estimate 14 ($T_1$).

5.3 Second Estimation

Operations of the second estimator 12 (and/or step S102) which may be used, in examples, for providing a second estimate 16 on the basis of the current frame 13 and the previously selected (output) estimate 19″ (pitch lag obtained for the previous frame) are here discussed. The method 40 is shown in FIG. 4. The second estimate 16 may be different from the first estimate 14. Further, the estimated pitch lag may be different, in some examples, from the pitch lag as previously estimated.

With reference to FIG. 5, according to examples, at step S41, the search is restricted to a restricted group of lags, which are within a particular second subinterval 52. The search is based on the lag 51 which corresponds to the (previously) selected value 19″. The search is restricted to the lags, in the second subinterval 52, which are within a value δ (which may be, for example, chosen among, 2, 3, 4, 5, 6, 7, 8, 9, 10 or another positive natural number; in some examples, δ may be a percentage of the length of the frame, so that, if the frame has N samples, δ is a percentage between 1% and 30%, in particular 15% and 25%, of N). δ may be a pre-defined lag number threshold or a predefined percentage.

According to examples, at step S42, autocorrelation values within the subinterval 52 are calculated, e.g., by the second measurer 22.

According to examples, at step S42, the maximum value among the results of the autocorrelation is retrieved. The second estimate $T_2$ is the value that maximizes the autocorrelation in the neighborhood of the pitch lag of the current frame among the lags within the second subinterval centered in the previously selected value 19″, e.g.:

$$T_2 = \underset{T=T_{prev}-\delta,\ldots,T_{prev}+\delta}{\operatorname{argmax}} R(T)$$

where $T_{prev}$ is the final pitch lag 51 (19″) as previously selected (by the selector 17) and δ the constant (e.g. δ=4) which defines the subinterval 52. The value $T_2$ may be provided as output 16 of the second estimator 12.

Notably, the first estimate 14 and the second estimate 16 may be significantly different from each other.

R (T) (whose domain is here restricted between $T_{prev}-\delta$ and $T_{prev}+\delta$) is an example of a second correlation function whose maximum value is associated to the second pitch lag estimate 16 ($T_2$).

5.4 First and Second Correlation Measurements

The first measurer 21 and/or the second measurer 22 may perform correlation measurements. The first measurer 21 and/or the second measurer 22 may perform autocorrelation measurements. The correlation and/or autocorrelation measurements may be normalized. An example, is here provided. normcorr(T) may be the normalized correlation of the signal x at pitch lag T $$normcorr(T) = \frac{\sum_{n=0}^{N-1} x(n)x(n-T)}{\sqrt{\sum_{n=0}^{N-1} x^2(n) \sum_{n=0}^{N-1} x^2(n-T)}}$$

Therefore, the first correlation measurement 23 may be normcorr($T_1$), where $T_1$ is the first estimate 14, and the second correlation measurement 25 may be normcorr($T_2$), where $T_2$ is the second estimate 16.

Notably, first correlation measurement 23 is the normalized value of R($T_1$) (or $R_w(T_1)$), while the second correlation measurement 25 is the normalized value of R($T_2$).

5.5 Comparison with Threshold

It is now possible to give an example of how to compare the correlation for performing the selection. As example is provided by the following formula:

$$T_{best} = \begin{cases} T_1 & \text{if } normcorr(T_2) \leq \alpha normcorr(T_1) \\ T_2 & \text{otherwise} \end{cases}$$

αnormcorr($T_1$) may be seen as a pitch lag selection threshold 24: if normcorr($T_2$)≤αnormcorr($T_1$), the selector chooses $T_1$, otherwise the selector chooses $T_2$. The value $T_{best}$ (or an information associated thereto) may be therefore the selected output value 19 (as either $T_1$ or $T_2$) and provided to the decoder (e.g., for LTPF) and that will be used, as 19″, by the second estimator 12 for obtaining the second estimate 16.

5.6 The Method 40

The method 40, associated to the method 30, increases the performances with respect to a technique only based on the method 30.

With small additional complexity, it is possible to significantly improve the performance by making the pitch contour more stable and continuous.

The method 40 finds a second maximum for the autocorrelation function. It is not the global maximum like in the method 30, but a local maximum in the neighbourhood of the pitch lag of the previous frame. This second pitch lag, if selected, produces a smooth and continuous pitch contour. We however don't select this second pitch lag in all cases. If there is an expected change in the fundamental frequency for example, it is better to keep the global maximum.

The final selection is whether to select the first pitch lag $T_1$ (14) found with method 30 or the second pitch lag $T_2$ (16) found with method 40. This decision is based on a measure of periodicity. We choose the normalized correlation as measure of periodicity. It is 1 if the signal is perfectly periodic and 0 if it is aperiodic. The second pitch lag $T_2$ is then chosen if its corresponding normalized correlation is higher than the normalized correlation of the first pitch lag $T_1$, scaled by a parameter α. This parameter α<1 makes the decision even smoother by selecting $T_2$ (16) even when its normalized correlation is slightly below the normalized correlation of the first pitch lag $T_1$ (14).

5.7 Considerations On the Technique

Reference is made to FIGS. 5a-5d.

An example of first estimation is shown in FIG. 5a: there is chosen the pitch-lag which corresponds to the maximum of the auto-correlation function.

It is based on the fact that the auto-correlation of a harmonic signal (with some given pitch) contains peaks at the position of the pitch-lag and all multiples of this pitch-lag.

To avoid selecting a peak corresponding to a multiple of the pitch-lag, the auto-correlation function is weighted, as in FIG. 5b, putting less emphasis to the higher pitch-lags. This is for example used in [7].

The global maximum of the weighted autocorrelation is then assumed to correspond to the pitch-lag of the signal.

In general, the first estimation taken alone works satisfactorily: it gives the correct pitch in the great majority of frames.

The first estimation has also the advantage of a relatively low complexity if the number of lags of the autocorrelation function (first subinterval) is relatively low.

FIG. 5a shows the (non-weighted) autocorrelation of the input signal.

There are five peaks: the first peak 53 corresponds to the pitch-lag, and the other ones correspond to multiples 53' of this pitch-lag.

Taking the global maximum of the (non-weighted) autocorrelation would give in this case the wrong pitch-lag: it would choose a multiple of it, in this case 4 times the correct pitch-lag.

However, the global maximum of the weighted autocorrelation (FIG. 5b) is the correct pitch lag.

The first estimation works in several cases. However, there are some cases where it produces an unstable estimate.

One of this cases is a polyphonic music signal which contains a mix of several tones with different pitches. In this case, it is difficult to extract a single pitch from a multi-pitch signal. The first estimator 11 could in that case estimate in one frame the pitch of one of the tones (or even maybe a multiple of it), and in the next frame possibly the pitch of another tone (or a multiple of it). So even if the signal is stable (the pitch of the different tones does not change from one frame to the next), the pitch detected by the first estimation can be unstable (the pitch changes significantly from one frame to the next).

This unstable behaviour is a major problem for LTPF. When the pitch is used for LTPF, it is most important to have a continuous pitch contour, otherwise some artefacts could be heard in the LTPF filtered output signal.

FIG. 5c shows the weighted autocorrelation and its maximum in a frame of a stable multi-pitch signal. A pitch lag 19" is correctly retrieved at "20" in correspondence with the peak 54.

FIG. 5d shows the same in the subsequent frame.

In this case, the first three peaks 54', 54", and 54'" have a very close amplitude. So very slight changes between the two consecutive frames can significantly change the global maximum and the estimated pitch-lag.

The solution adopted in the present invention solves these instability problems.

The present solution selects, besides the pitch lag associated to the peak in the frame, a pitch-lag which is close to the pitch-lag of the previous frame.

Figure 1B:
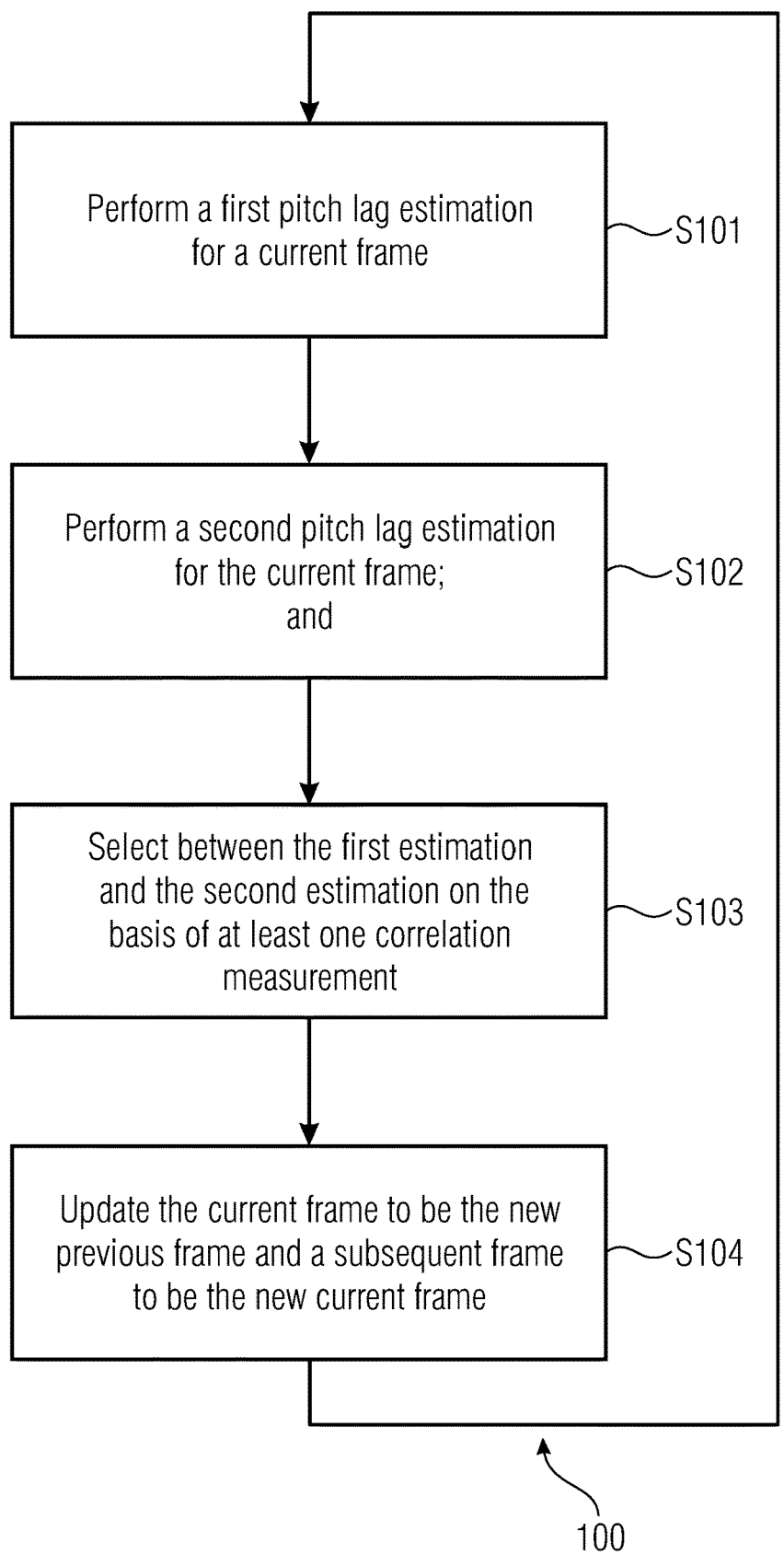
Figure 2:
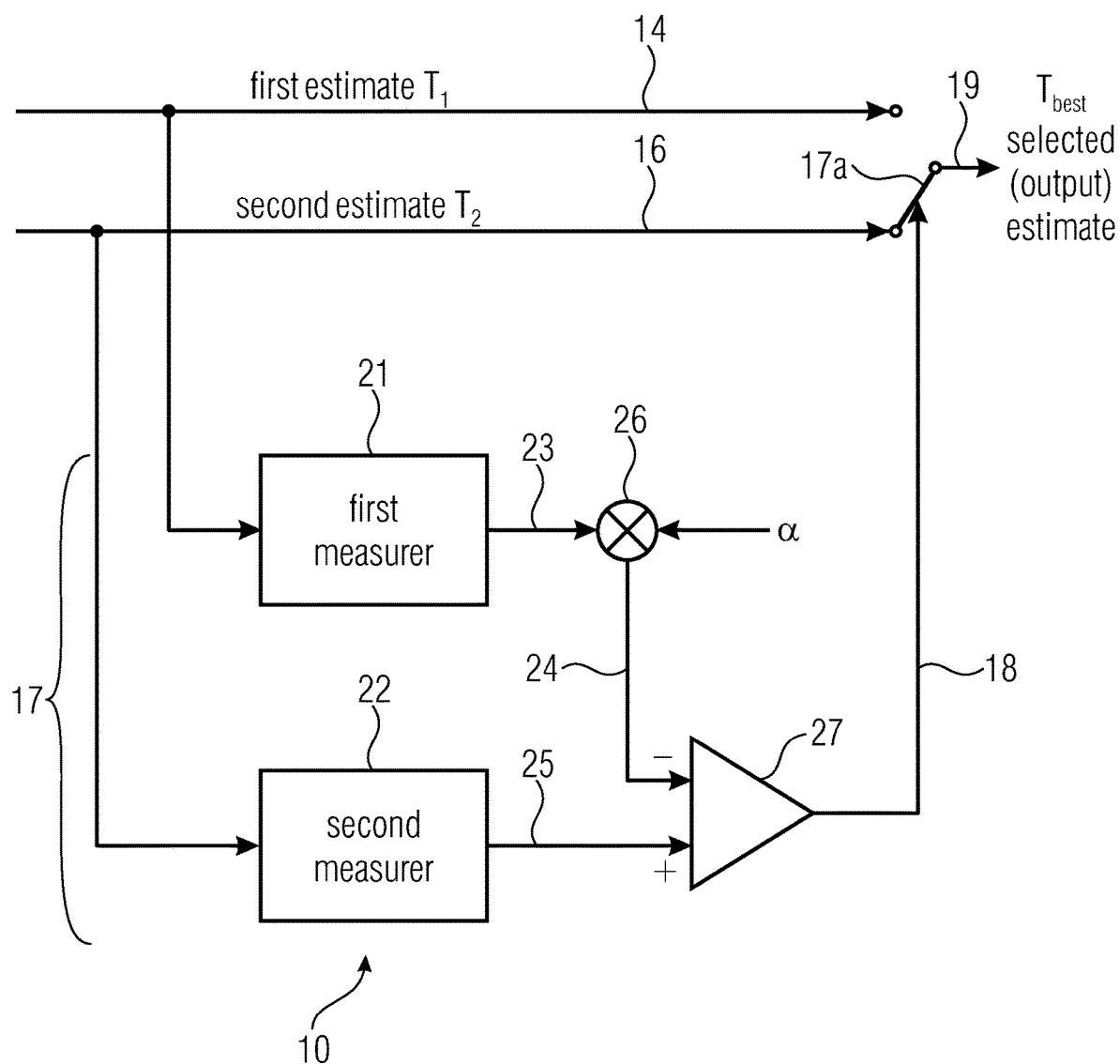
Figure 3:
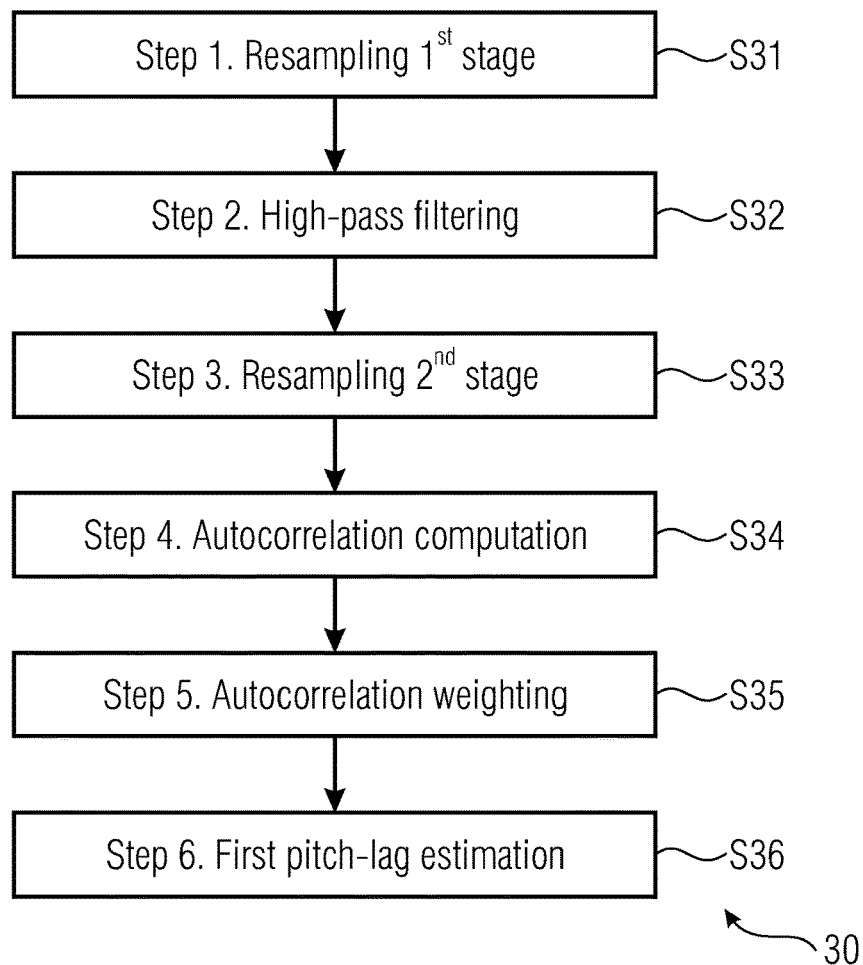
Figure 4:
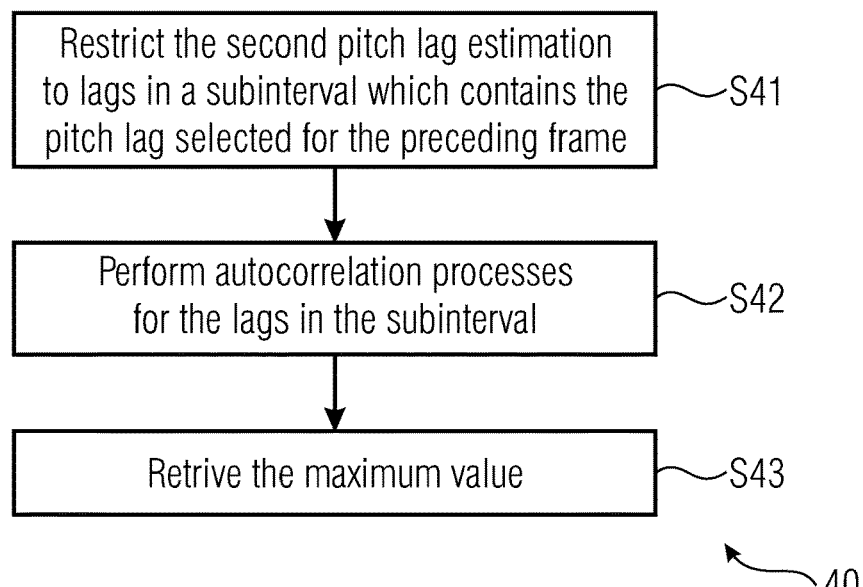
Figure 5:
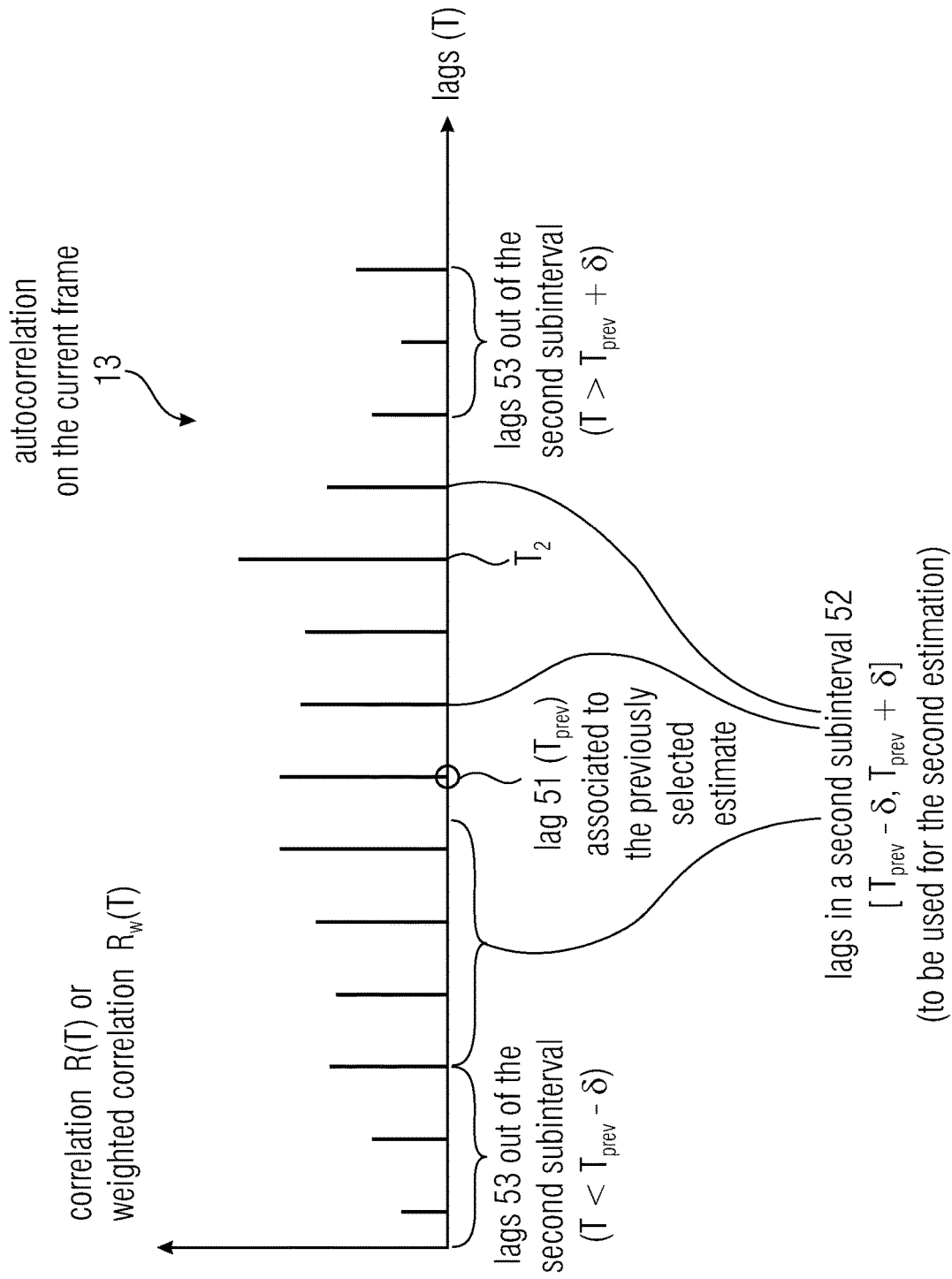
FIGS. 5c and 5d illustrate this problem.
Figure 5A:
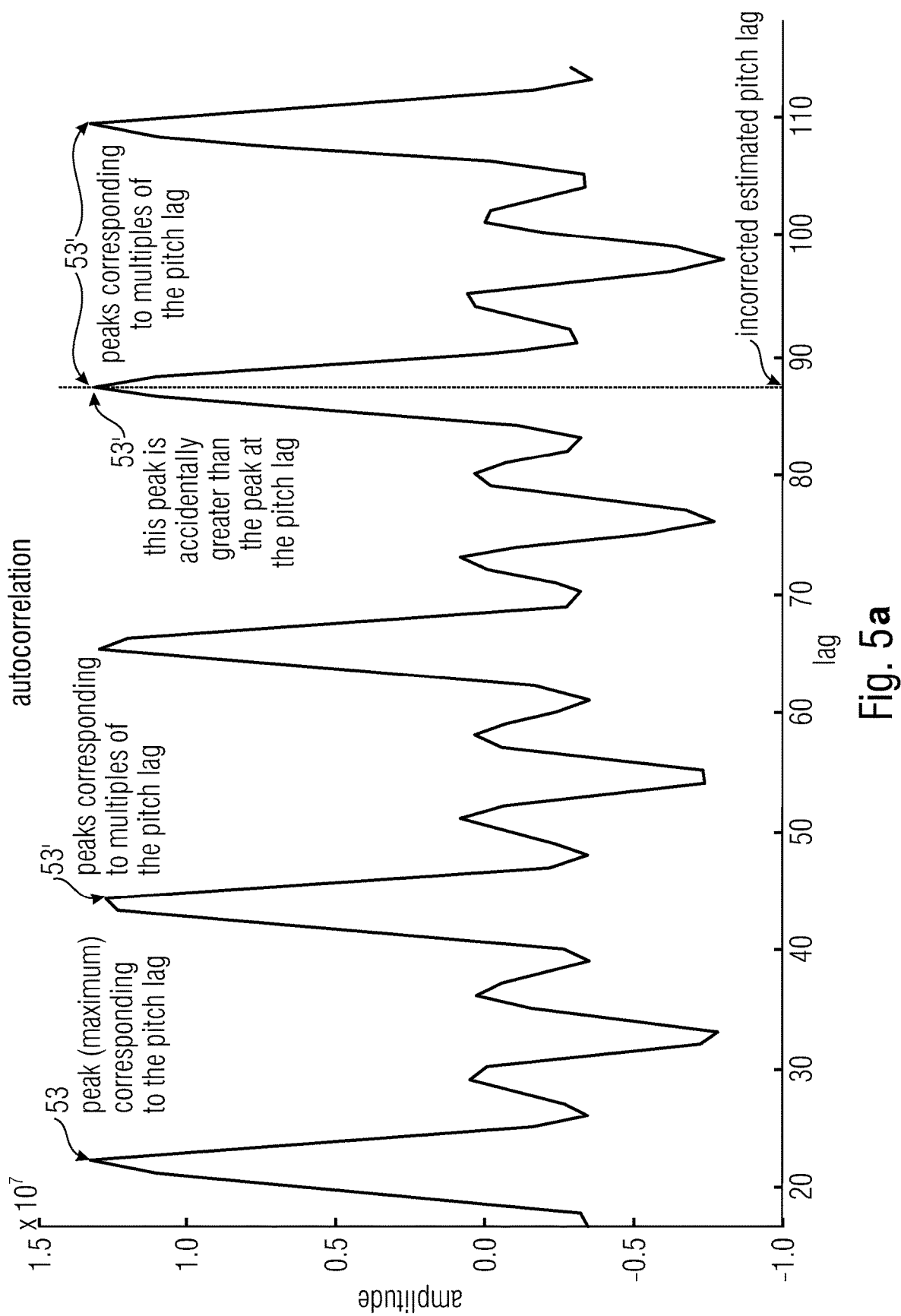
Figure 5:
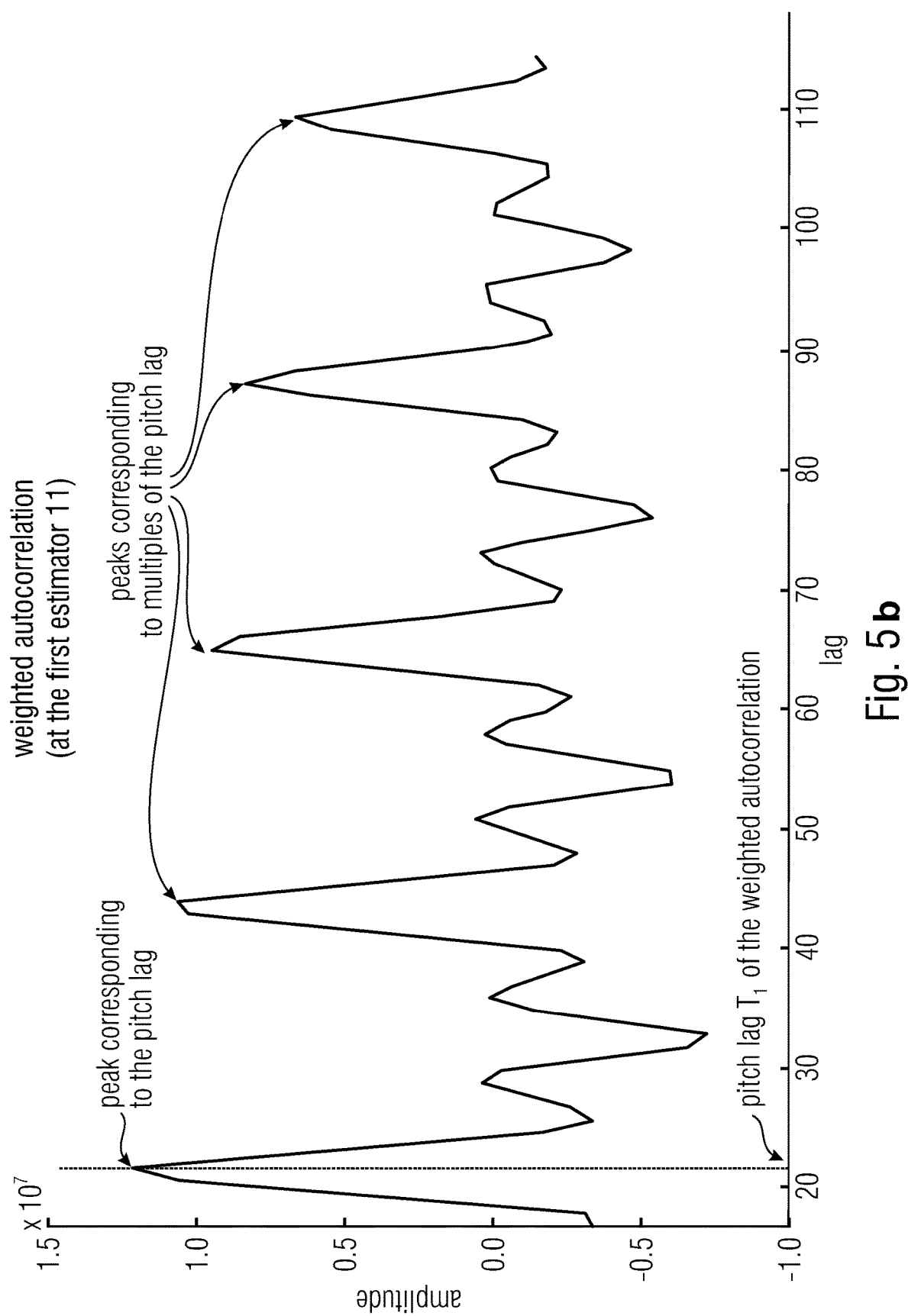
Figure 5C:
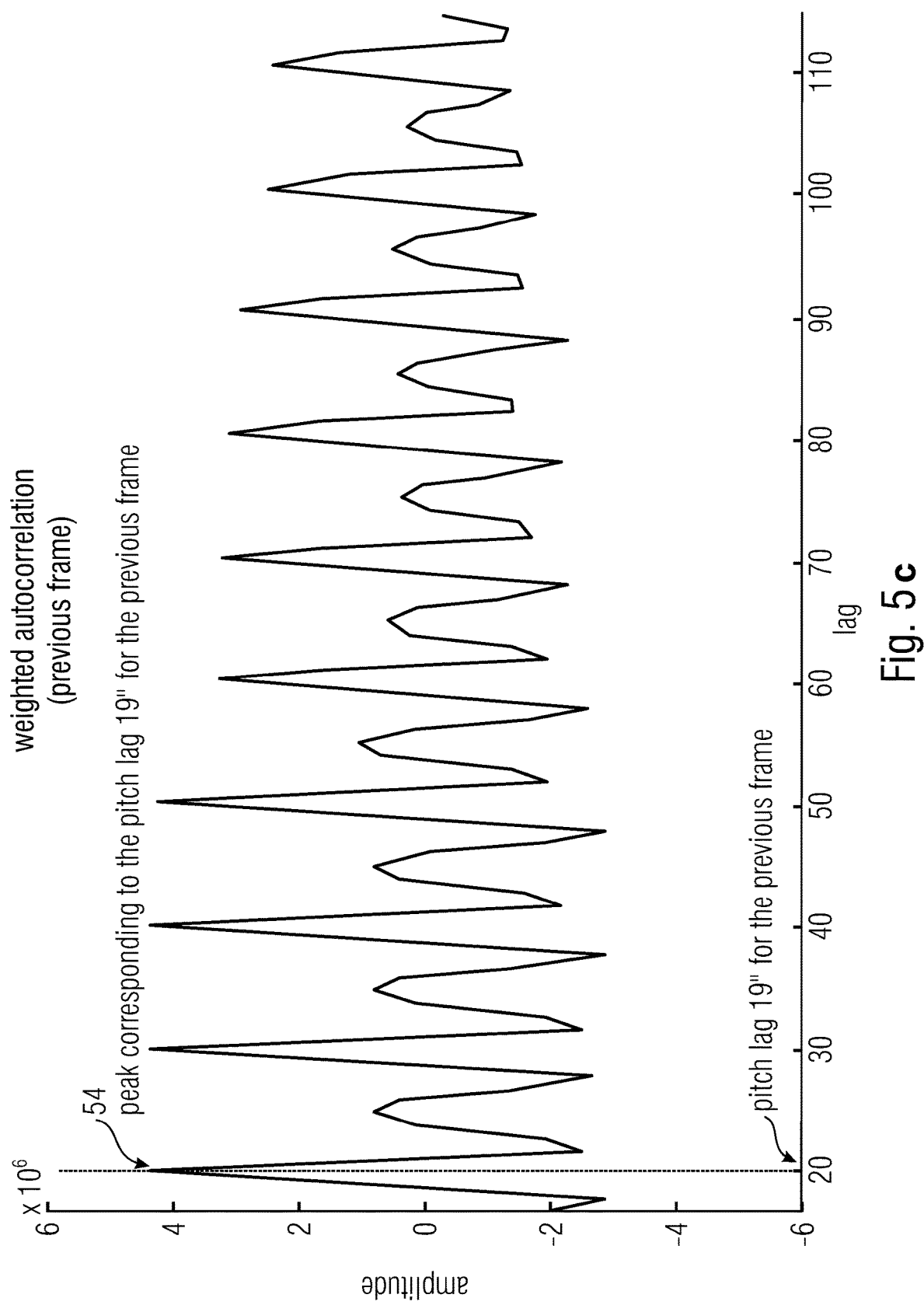
Figure 5D:
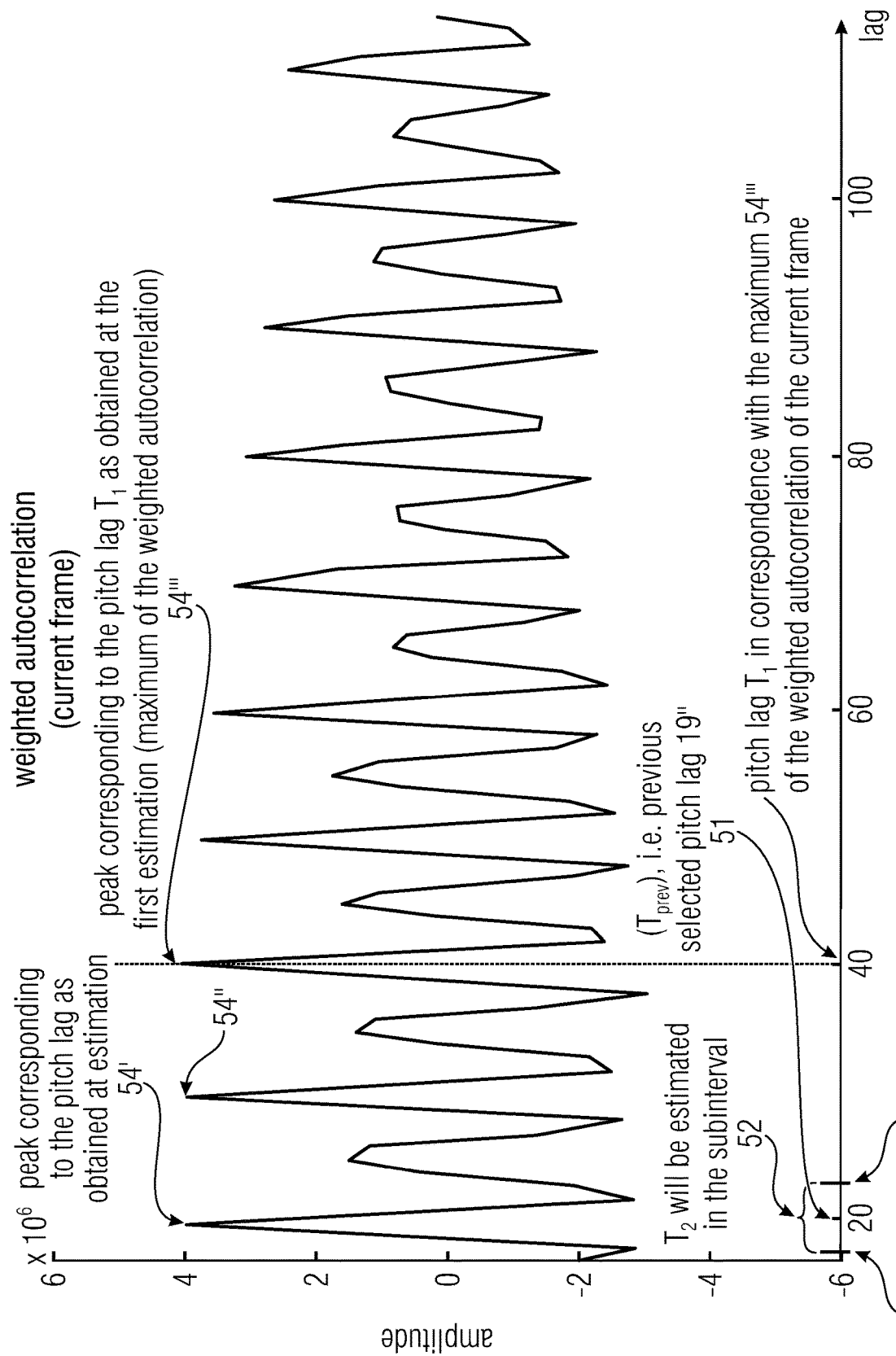

For example, FIG. 5c corresponds to the previous frame and FIG. 5d corresponds to the current frame. We intend to verify if it is advantageous to select in the current frame a pitch-lag around 20 (i.e., the pitch-lag 19" or $T_{prev}$ of the previous frame) and not a pitch-lag of 40 as given by the first estimator 11.

To do so, a second estimation is performed (e.g., by the second estimator 12) by estimating a second pitch-lag $T_2$ which maximizes the autocorrelation function around a subinterval 52 the pitch-lag of the previous frame ($T_{prev}-\delta$, $T_{prev}+\delta$). In the case of FIG. 5d, this second pitch-lag $T_2$ would be 20 (the first pitch-lag being 40). (Even if in this case $T_2=T_{prev}$, this is not a generate rule. In general, $T_{prev}-\delta \leq T_2 \leq T_{prev}+\delta$). Notably, in examples, in order to estimate $T_2$ the autocorrelation is not weighted.

However, we don't want to select in all cases this second pitch-lag $T_2$. We want to select either the first pitch-lag $T_1$ or the second pitch-lag $T_2$ based on some criteria. This criteria is based on the normalized correlation (NC), e.g., as measured by the selector 17, which is generally considered a good measure of how periodic is a signal at some particular pitch-lag (a NC of 0 means not periodic at all, a NC of 1 means perfectly periodic).

There are then several cases:

- If the NC of the second estimate $T_2$ is higher than the NC of the first estimate $T_1$: we can be sure that the second estimate $T_2$ is better than the first estimate $T_1$, because the second estimate $T_2$ has better NC and it produces a stable decision (pitch of previous frame and pitch of current frame are very close), so we can safely select it.
- If the NC of the second estimate $T_2$ is much lower than the NC of the first estimate: this indicates that the pitch 19" of the previous frame does not correspond to any periodicity in the current frame, the signal is unstable and the pitch has changed, so it does not make sense to keep the pitch 19" of the previous frame and to try to produce a stable decision. In that case, the second estimate $T_2$ is ignored and the first estimate $T_1$ is selected.
- If the NC of the second estimate $T_2$ is slightly lower than the NC of the first estimate $T_1$: the NC of both estimates $T_1$ and $T_2$ are close and we may choose in that case the estimate which produces a stable decision (i.e., the second estimate $T_2$) even if it has slightly worse NC. The parameter $\alpha$ ($\alpha<1$) is used for that case: it allows selecting the second estimate $T_2$ even if it has slightly lower NC. The tuning of this parameter $\alpha$ allows us to bias the selection towards the first estimate $T_1$ or the second estimate $T_2$: a lower value means the second estimate would be selected more often (=the decision would be more stable). 0.85 (or a value between 0.8 and 0.9) is a good trade-off: it selects the second estimate $T_2$ often enough so that the decision is stable enough for LTPF.

The additional steps provided on top of the first estimation (second estimation and selection) have a very low complexity. Therefore, the proposed invention has low complexity.

6. Examples of Encoding/Decoding Systems

Figure 6:
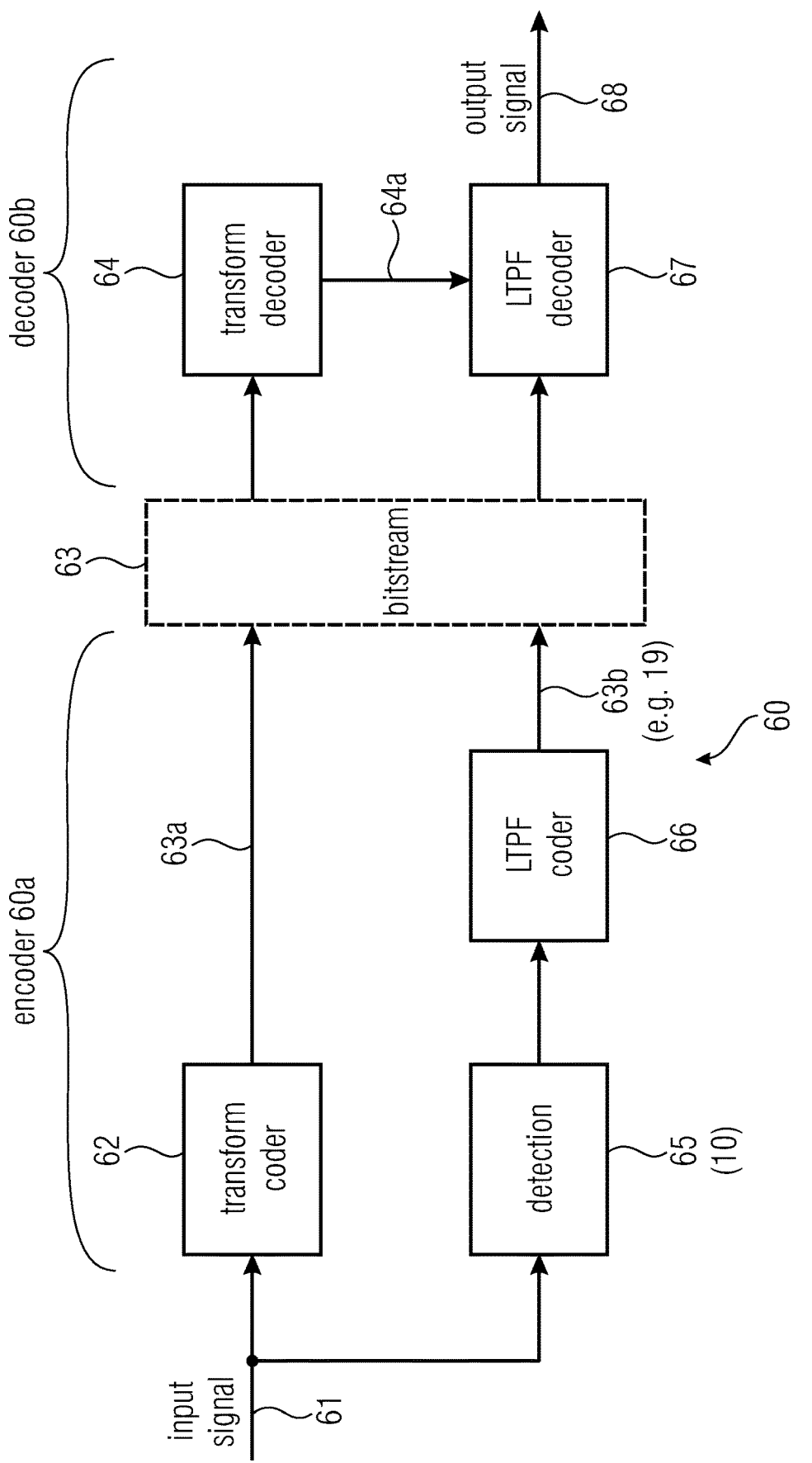

FIG. 6 shows a block scheme relating to the operations for encoding/decoding. The scheme shows a system 60 comprising an encoder 60a (which may comprise the apparatus 10) and a decoder 60b. The encoder 60a obtains an input information signal 61 (which may be and audio signal and/or may be divided between frames, such as the current frame 13 and the previous frame) and prepares a bitstream 63. The decoder 60b obtains the bitstream 63 (e.g., wirelessly, e.g., using Bluetooth) to generate an output signal 68 (e.g., an audio signal).

The encoder 60a may generate, using a transform coder 62, a frequency domain representation 63a (or a processed version thereof) of the information signal 61 and provide it to the decoder 60b in the bitstream 63. The decoder 60b may comprise a transform decoder for obtaining outputs signal 64a.

The encoder 60a may generate, using a detection unit 65, data useful for performing LTPF at the decoder 60b. These data may comprise a pitch lag estimate (e.g., 19) and/or a gain information. These data may be encoded in the bitstream 63 as data 63b in control fields. The data 63b (which may comprise the final estimate 19 of the pitch lag) may be prepared by a LTPF coder 66 (which, in some examples, may decide whether to encode the data 63b). These data may be used by an LTPF decoder 67 which may apply them to the output signal 64a from the transform decoder 64 to obtain the outputs signal 68.

7. Examples, e.g., for LTPF

7.1 Parameters (e.g., LTPF Parameters) at the Encoder

Examples of the calculations of the LTPF parameters (or other types of parameters) are here provided.

An example of preparing the information for the LTPF is provided in the next subsections.

7.2.1. Resampling

An example of (optional) resampling technique is here discussed (other techniques may be used).

The input signal at sampling rate $f_s$ may be resampled to a fixed sampling rate of 12.8 kHz. The resampling is performed using an upsampling+low-pass-filtering+downsampling approach that can be formulated as follows $$x_{12.8}(n) = P \sum_{k=-\frac{120}{P}}^{\frac{120}{P}} x\left(\left\lfloor \frac{15n}{P} \right\rfloor + k - \frac{120}{P}\right) h_{6.4}(Pk - 15n \bmod P)$$

for $n = 0 \ldots 127$ with $\lfloor \ \rfloor$ indicating a trucked value (rounded to the integer below), $x(n)$ is the input signal, $x_{12.8}(n)$ is the resampled signal at 12.8 kHz, $$P = \frac{192 \text{ kHz}}{f_s}$$

is the upsampling factor and $h_{6.4}$ is the impulse response of a FIR low-pass filter given by $$h_{64}(n) = \begin{cases} \text{tab\_resamp\_filter}[n + 119], & \text{if } -120 < n < 120 \\ 0, & \text{otherwise} \end{cases}$$

An example, of tab_resamp_filter is provided in the following table:

```
double tab_resamp_filter[239] = {
-2.043055832879108e-05,  -4.463458936757081e-05,  -7.163663994481459e-05,
-1.001011132655914e-04,  -1.283728480660395e-04,  -1.545438297704662e-04,
-1.765445671257668e-04,  -1.922569599584802e-04,  -1.999643819250038e-04,
-1.968886856400547e-04,  -1.825383318834690e-04,  -1.556394266046803e-04,
-1.158603651792638e-04,  -6.358930335348977e-05,  +2.810064795067786e-19,
+7.292180213001337e-05,  +1.523970757644272e-04,  +2.349207769898906e-04,
+3.163786496265269e-04,  +3.922117380894736e-04,  +4.576238491064392e-04,
+5.078242936704864e-04,  +5.382955231045915e-04,  +5.450729176175875e-04,
+5.250221548270982e-04,  +4.760984242947349e-04,  +3.975713799264791e-04,
+2.902002172907180e-04,  +1.563446669975615e-04,  -5.818801416923580e-19,
-1.732527127898052e-04,  -3.563859653300760e-04,  -5.411552308801147e-04,
-7.184140229675020e-04,  -8.785052315963854e-04,  -1.011714513697282e-03,
-1.108767055632304e-03,  -1.161345220483996e-03,  -1.162601694464620e-03,
-1.107640974148221e-03,  -9.939415631563015e-04,  -8.216921898513225e-04,
-5.940177657925908e-04,  -3.170746535382728e-04,  +9.746950818779534e-19,
+3.452937604228947e-04,  +7.044808705458705e-04,  +1.061334465662964e-03,
+1.398374734488549e-03,  +1.697630799350524e-03,  +1.941486748731660e-03,
+2.113575906669355e-03,  +2.199682452179964e-03,  +2.188606246517629e-03,
+2.072945458973295e-03,  +1.849752491313908e-03,  +1.521021876908738e-03,
+1.093974255016849e-03,  +5.811080624426164e-04,  -1.422482656398999e-18,
-6.271537303228204e-04,  -1.274251404913447e-03,  -1.912238389850182e-03,
-2.510269249380764e-03,  -3.037038298629825e-03,  -3.462226871101535e-03,
-3.758006719596473e-03,  -3.900532466948409e-03,  -3.871352309895838e-03,
-3.658665583679722e-03,  -3.258358512646846e-03,  -2.674755551508349e-03,
-1.921033054368456e-03,  -1.019254326838640e-03,  +1.869623690895593e-18,
+1.098415446732263e-03,  +2.231131973532823e-03,  +3.348309272768835e-03,
+4.397022774386510e-03,  +5.323426722644900e-03,  +6.075105310368700e-03,
+6.603520247552113e-03,  +6.866453987193027e-03,  +6.830342695906946e-03,
+6.472392343549424e-03,  +5.782375213956374e-03,  +4.764012726389739e-03,
+3.435863514113467e-03,  +1.831652835406657e-03,  -2.251898372838663e-18,
-1.996476188279370e-03,  -4.082668858919100e-03,  -6.173080374929424e-03,
-8.174448945974208e-03,  -9.988823864332691e-03,  -1.151698705819990e-02,
-1.266210056063963e-02,  -1.333344579518481e-02,  -1.345011199343934e-02,
-1.294448809639154e-02,  -1.176541543002924e-02,  -9.880867320401294e-03,
-7.280036402392082e-03,  -3.974730209151807e-03,  +2.509617777250391e-18,
+4.586044219717467e-03,  +9.703248998383679e-03,  +1.525124770818010e-02,
```

```
+2.111205854013017e-02,  +2.715337236094137e-02,  +3.323242450843114e-02,
+3.920032029020130e-02,  +4.490666443426786e-02,  +5.020433088017846e-02,
+5.495420172681558e-02,  +5.902970324375908e-02,  +6.232097270672976e-02,
+6.473850225260731e-02,  +6.621612450840858e-02,  +6.671322871619612e-02,
+6.621612450840858e-02,  +6.473850225260731e-02,  +6.232097270672976e-02,
+5.902970324375908e-02,  +5.495420172681558e-02,  +5.020433088017846e-02,
+4.490666443426786e-02,  +3.920032029020130e-02,  +3.323242450843114e-02,
+2.715337236094137e-02,  +2.111205854013017e-02,  +1.525124770818010e-02,
+9.703248998383679e-03,  +4.586044219717467e-03,  +2.509617777250391e-18,
-3.974730209151807e-03,  -7.280036402392082e-03,  -9.880867320401294e-03,
-1.176541543002924e-02,  -1.294448809639154e-02,  -1.345011199343934e-02,
-1.333344579518481e-02,  -1.266210056063963e-02,  -1.151698705819990e-02,
-9.988823864332691e-03,  -8.174448945974208e-03,  -6.173080374929424e-03,
-4.082668858919100e-03,  -1.996476188279370e-03,  -2.251898372838663e-18,
+1.831652835406657e-03,  +3.435863514113467e-03,  +4.764012726389739e-03,
+5.782375213956374e-03,  +6.472392343549424e-03,  +6.830342695906946e-03,
+6.866453987193027e-03,  +6.603520247552113e-03,  +6.075105310368700e-03,
+5.323426722644900e-03,  +4.397022774386510e-03,  +3.348309272768835e-03,
+2.231131973532823e-03,  +1.098415446732263e-03,  +1.869623690895593e-18,
-1.019254326838640e-03,  -1.921033054368456e-03,  -2.674755551508349e-03,
-3.258358512646846e-03,  -3.658665583679722e-03,  -3.871352309895838e-03,
-3.900532466948409e-03,  -3.758006719596473e-03,  -3.462226871101535e-03,
-3.037038298629825e-03,  -2.510269249380764e-03,  -1.912238389850182e-03,
-1.274251404913447e-03,  -6.271537303228204e-04,  -1.422482656398999e-18,
+5.811080624426164e-04,  +1.093974255016849e-03,  +1.521021876908738e-03,
+1.849752491313908e-03,  +2.072945458973295e-03,  +2.188606246517629e-03,
+2.199682452179964e-03,  +2.113575906669355e-03,  +1.941486748731660e-03,
+1.697630799350524e-03,  +1.398374734488549e-03,  +1.061334465662964e-03,
+7.044808705458705e-04,  +3.452937604228947e-04,  +9.746950818779534e-19,
-3.170746535382728e-04,  -5.940177657925908e-04,  -8.216921898513225e-04,
-9.939415631563015e-04,  -1.107640974148221e-03,  -1.162601694464620e-03,
-1.161345220483996e-03,  -1.108767055632304e-03,  -1.011714513697282e-03,
-8.785052315963854e-04,  -7.184140229675020e-04,  -5.411552308801147e-04,
-3.563859653300760e-04,  -1.732527127898052e-04,  -5.818801416923580e-19,
+1.563446669975615e-04,  +2.902002172907180e-04,  +3.975713799264791e-04,
+4.760984242947349e-04,  +5.250221548270982e-04,  +5.450729176175875e-04,
+5.382955231045915e-04,  +5.078242936704864e-04,  +4.576238491064392e-04,
+3.922117380894736e-04,  +3.163786496265269e-04,  +2.349207769898906e-04,
+1.523970757644272e-04,  +7.292180213001337e-05,  +2.810064795067786e-19,
-6.358930335348977e-05,  -1.158603651792638e-04,  -1.556394266046803e-04,
-1.825383318834690e-04,  -1.968886856400547e-04,  -1.996438192500382e-04,
-1.922569599584802e-04,  -1.765445671257668e-04,  -1.545438297704662e-04,
-1.283728480660395e-04,  -1.001011132655914e-04,  -7.163663994481459e-05,
-4.463458936757081e-05,  -2.043055832879108e-05};
```

7.2.2. High-Pass Filtering

An example of (optional) high-pass filter technique is here discussed (other techniques may be used).

The resampled signal may be high-pass filtered using a 2-order IIR filter whose transfer function may be given by $$H_{50}(z) = \frac{0.9827947082978771 - 1.965589416595754z^{-1} + 0.9827947082978771z^{-2}}{1 - 1.965293372626904z^{-1} + 0.965885460568817z^{-2}}$$

7.2.3. Pitch Detection

An example of pitch detection technique is here discussed (other techniques may be used).

The signal $x_{12.8}(n)$ may be (optionally) downsampled by a factor of 2 using $$x_{6.4}(n) = \sum_{k=0}^{4} x_{12.8}(2n+k-3)h_2(k) \text{ for } n = 0 \ldots 63$$

with $h_2 = \{0.1236796411180537, 0.2353512128364889, 0.2819382920909148, 0.2353512128364889, 0.1236796411180537\}$.

The autocorrelation of $x_{6.4}(n)$ may be computed by $$R_{6.4}(k) = \sum_{n=0}^{63} x_{6.4}(n)x_{6.4}(n-k) \text{ for } k = k_{min} \ldots k_{max}$$

with $k_{min}=17$ and $k_{max}=114$ are the minimum and maximum lags which define the first subinterval (other values for $k_{min}$ and $k_{max}$ may be provided).

The autocorrelation may be weighted using $$R_{6.4}^w(k) = R_{6.4}(k)w(k) \text{ for } k=k_{min} \ldots k_{max}$$

with $w(k)$ is defined as follows $$w(k) = 1 - 0.5\frac{(k - k_{min})}{(k_{max} - k_{min})} \text{ for } k = k_{min} \ldots k_{max}$$

The first estimate 14 of the pitch lag $T_1$ may be the lag that maximizes the weighted autocorrelation $$T_1 = \underset{k=k_{min} \cdots k_{max}}{\operatorname{argmax}} R_{6.4}^w(k)$$

The second estimate 16 of the pitch lag $T_2$ may be the lag that maximizes the non-weighted autocorrelation in the neighborhood of the pitch lag (19'') estimated in the previous frame $$T_2 = \underset{k=k'_{min} \cdots k'_{max}}{\operatorname{argmax}} R_{6.4}(k)$$

with $k'_{min} = \max(k_{min}, T_{prev}-4)$, $k'_{max} = \min(k_{max}, T_{prev}+4)$ and $T_{prev}$ is the final pitch lag estimated in the previous frame (and its selection therefore conditioned by the previously selected pitch lag).

The final estimate 19 of the pitch lag in the current frame 13 may then be given by $$T_{curr} = \begin{cases} T_1 & \text{if } normcorr(x_{6.4}, 64, T_2) \leq 0.85 \cdot normcorr(x_{6.4}, 64, T_1) \\ T_2 & \text{otherwise} \end{cases}$$

with $normcorr(x, L, T)$ is the normalized correlation of the signal $x$ of length $L$ at lag $T$ $$normcorr(x, L, T) = \frac{\sum_{n=0}^{L-1} x(n)x(n-T)}{\sqrt{\sum_{n=0}^{L-1} x^2(n) \sum_{n=0}^{L-1} x^2(n-T)}}$$

Each normalized correlation 23 or 25 may be at least one of the measurements obtained by the signal first or second measurer 21 or 22.

7.2.4. LTPF Bitstream

In some examples, the first bit of the LTPF bitstream signals the presence of the pitch-lag parameter in the bitstream. It is obtained by $$pitch\_present = \begin{cases} 1 & \text{if } normcorr(x_{64}, 64, T_{curr}) > 0.6 \\ 0 & \text{otherwise} \end{cases}$$

(Instead of 0.6, a different threshold, e.g., between 0.4 and 0.8, or 0.5 and 0.7, or 0.55 and 0.65 could be used, for example.)

If pitch_present is 0, no more bits are encoded, resulting in a LTPF bitstream of only one bit.

If pitch_present is 1, two more parameters are encoded, one pitch-lag parameter encoded on 9 bits, and one bit to signal the activation of LTPF. In that case, the LTPF bitstream is composed by 11 bits.

$$nbits_{LTPF} = \begin{cases} 1, & \text{if } pitch\_present = 0 \\ 11, & \text{otherwise} \end{cases}$$

7.2.5. LTPF Pitch Lag Parameters

An example for obtaining an LTPF pitch lag parameters is here discussed (other techniques may be used).

The integer part of the LTPF pitch lag parameter may be given by $$ltpf\_pitch\_int = \underset{k=k''_{min} \cdots k''_{max}}{\operatorname{argmax}} R_{12.8}(k)$$

with $$R_{12.8}(k) = \sum_{n=0}^{127} x_{12.8}(n) x_{12.8}(n-k)$$

and $$k''_{min} = \max(32, 2T_{curr} - 4), k''_{max} = \min(228, 2T_{curr} + 4).$$

The fractional part of the LTPF pitch lag may then be given by $$pitch\_fr = \begin{cases} 0 & \text{if } pitch\_int \geq 157 \\ \underset{d=-2,0,2}{\operatorname{argmax}} interp(R_{12.8}, pitch\_int, d) & \text{if } 157 > pitch\_int \geq 127 \\ \underset{d=-3\ldots 3}{\operatorname{argmax}} interp(R_{12.8}, pitch\_int, d) & \text{if } 127 > pitch\_int > 32 \\ \underset{d=0\ldots 3}{\operatorname{argmax}} interp(R_{12.8}, pitch\_int, d) & \text{if } pitch\_int = 32 \end{cases}$$

with $$interp(R, T, d) = \sum_{k=-4}^{4} R(T+k) h_4(4k-d)$$

and $h_4$ is the impulse response of a FIR low-pass filter given by $$h_4(n) = \begin{cases} tab\_ltpf\_interp\_R(n+15), & \text{if } -16 < n < 16 \\ 0, & \text{otherwise} \end{cases}$$

tab_ltpf_interp_R may be, for example:

```
double tab_ltpf_interp_R[31] = {
-2.874561161519444e-03,  -3.001251025861499e-03,  +2.745471654059321e-03
+1.535727698935322e-02,  +2.868234046665657e-02,  +2.950385026557377e-02
+4.598334491135473e-03,  -4.729632459043440e-02,  -1.058359163062837e-01
-1.303050213607112e-01,  -7.544046357555201e-02,  +8.357885725250529e-02
+3.301825710764459e-01,  +6.032970076366158e-01,  +8.174886856243178e-01
+8.986382851273982e-01,  +8.174886856243178e-01,  +6.032970076366158e-01
+3.301825710764459e-01,  +8.357885725250529e-02,  -7.544046357555201e-02
-1.303050213607112e-01,  -1.058359163062837e-01,  -4.729632459043440e-02
+4.598334491135473e-03,  +2.950385026557377e-02,  +2.868234046665657e-02
+1.535727698935322e-02,  +2.745471654059321e-03,  -3.001251025861499e-03
-2.874561161519444e-03};
```

If pitch_fr<0 then both pitch_int and pitch_fr are modified according to pitch_int=pitch_int−1 pitch_fr=pitch_fr+4

Finally, the pitch lag parameter index is given by $$\text{pitch\_index} = \begin{cases} \text{pitch\_int} + 283 & \text{if pitch\_int} \geq 157 \\ 2\text{pitch\_int} + \frac{\text{pitch\_fr}}{2} = 126 & \text{if } 157 > \text{pitch\_int} \geq 127 \\ 4\text{pitch\_int} + \text{pitch\_fr} - 128 & \text{if } 127 > \text{pitch\_int} \end{cases}$$

7.2.6 LTPF Activation Bit

A normalized correlation is first computed as follows $$nc = \frac{\sum_{n=0}^{127} x_i(n, 0) x_i(n - \text{pitch\_int, pitch\_fr})}{\sqrt{\sum_{n=0}^{127} x_i^2(n, 0) \sum_{n=0}^{127} x_i^2(n - \text{pitch\_int, pitch\_fr})}}$$

with $$x_i(n, d) = \sum_{k=-2}^{2} x_{12.8}(n+k) h_i(4k - d)$$

and $h_i$ is the impulse response of a FIR low-pass filter given by $$h_i(n) = \begin{cases} \text{tab\_ltpf\_interp\_x12k8}(n + 7), & \text{if } -8 < n < 8 \\ 0, & \text{otherwise} \end{cases}$$

with tab_ltpf_interp_x12k8 is given by:

```
double tab_ltpf_interp_x12k8[15] = {
+6.698858366939680e−03,  +3.967114782344967e−02,  +1.069991860896389e−01,
+2.098804630681809e−01,  +3.356906254147840e−01,  +4.592209296082350e−01,
+5.500750019177116e−01,  +5.835275754221211e−01,  +5.500750019177116e−01,
+4.592209296082350e−01,  +3.356906254147840e−01,  +2.098804630681809e−01,
+1.069991860896389e−01,  +3.967114782344967e−02,  +6.698858366939680e−03};
```

The LTPF activation bit is then set according to:

```
if (
  (mem_ltpf_active==0 && mem_nc>0.94 && nc>0.94) ||
  (mem_ltpf_active==1 && nc>0.9) ||
  (mem_ltpf_active==1 && abs(pitch-mem_pitch)<2 && (nc-mem_nc)
  >−0.1 && nc>0.84)
)
{
  ltpf_active = 1;
}
else
{
  ltpf_active = 0;
}
``` with mem_ltpf_active is the value of ltpf_active in the previous frame (it is 0 if pitch_present=0 in the previous frame), mem_nc is the value of nc in the previous frame (it is 0 if pitch_present=0 in the previous frame), pitch=pitch_int+pitch_fr/4 and mem_pitch is the value of pitch in the previous frame (it is 0 if pitch_present=0 in the previous frame).

7.3 LTPF at the Decoder

The decoded signal in the frequency domain (FD), e.g., after MDCT (Modified Discrete Cosine Transformation) synthesis, MDST (Modified Discrete Sine Transformation) synthesis, or a synthesis based on another transformation, may be postfiltered in the time-domain using a IIR filter whose parameters may depend on LTPF bitstream data "pitch_index" and "ltpf_active". To avoid discontinuity when the parameters change from one frame to the next, a transition mechanism may be applied on the first quarter of the current frame.

In examples, an LTPF IIR filter can be implemented using $$\widehat{x_{ltpf}}(n) = \hat{x}(n) - \sum_{k=0}^{L_{num}} c_{num}(k) \hat{x}(n - k) + \sum_{k=0}^{L_{den}} c_{den}(k, p_{fr}) \widehat{x_{ltpf}}\left(n - p_{int} + \frac{L_{den}}{2} - k\right)$$

where $\hat{x}(n)$ is the filter input signal (i.e. the decoded signal after MDCT synthesis) and $\widehat{x_{ltpf}}(n)$ is the filter output signal.

The integer part $p_{int}$ and the fractional part $p_{fr}$ of the LTPF pitch lag may be computed as follows. First the pitch lag at 12.8 kHz is recovered using $$\text{pitch\_int} = \begin{cases} \text{pitch\_index} - 283 & \text{if pitch\_index} \geq 440 \\ \left[\frac{\text{pitch\_index}}{2}\right] - 63 & \text{if } 440 > \text{pitch\_index} \geq 380 \\ \left[\frac{\text{pitch\_index}}{4}\right] + 32 & \text{if } 380 > \text{pitch\_index} \end{cases}$$

-continued $$pitch\_fr = \begin{cases} 0 & \text{if } pitch\_index \geq 440 \\ 2*pitch\_index - 4*pitch\_int + 508 & \text{if } 440 > pitch\_index \geq 380 \\ pitch\_index - 4*pitch\_index + 128 & \text{if } 380 > pitch\_index \end{cases}$$

$$pitch = pitch\_int + \frac{pitch\_fr}{4}$$

The pitch lag may then be scaled to the output sampling rate $f_s$ and converted to integer and fractional parts using $$pitch_{f_s} = pitch * \frac{fs}{12800}$$

$$p_{up} = nint(pitch_{f_s} * 4)$$

$$p_{int} = \left\lfloor \frac{p_{up}}{4} \right\rfloor$$

$$p_{fr} = p_{up} - 4 * p_{int}$$

where $f_s$ is the sampling rate.

The filter coefficients $c_{num}(k)$ and $c_{den}(k, p_{fr})$ may be computed as follows $$c_{num}(k) = 0.85 * gain\_ltpf * tab\_ltpf\_num\_fs[gain\_ind][k] \text{ for } k = 0 \ldots L_{num}$$

$$c_{den}(k, p_{fr}) = gain\_ltpf * tab\_ltpf\_den\_fs[p_{fr}][k] \text{ for } k = 0 \ldots L_{den}$$

with $$L_{den} = \max\left(4, \frac{f_s}{4000}\right)$$

$$L_{num} = L_{den} - 2$$

and gain_ltpf and gain_ind may be obtained according to

```
fs_idx = min(4,(f_s/8000-1));
if (nbits < 320 + fs_idx*80)
{
  gain_ltpf = 0.4;
  gain_ind = 0;
}
else if (nbits < 400 + fs_idx*80)
{
  gain_ltpf = 0.35;
  gain_ind = 1;
}
else if (nbits < 480 + fs_idx*80)
{
  gain_ltpf = 0.3;
  gain_ind = 2;
}
else if (nbits < 560 + fs_idx*80)
{
  gain_ltpf = 0.25;
  gain_ind = 3;
}
else
{
  gain_ltpf = 0;
}
``` and the tables tab_ltpf_num_fs[gain_ind] [k] and tab_ltpf_den_fs[$p_{fr}$] [k] are predetermined.

Examples of tab_ltpf_num_fs[gain_ind] [k] are here provided (instead of "fs", the sampling rate is indicated):

```
double tab_ltpf_num_8000[4][3] = {
{6.023618207009578e−01, 4.197609261363617e−01, −1.883424527883687e−02},
{5.994768525584314e−01, 4.197609261363620e−01, −1.594928283631041e−02},
{5.967764663733787e−01, 4.197609261363617e−01, −1.324889095125780e−02},
{5.942410120098895e−01, 4.197609261363618e−01, −1.071343658776831e−02}};
double tab_ltpf_num_16000[4][3] = {
{6.023618207009578e−01, 4.197609261363617e−01, −1.883424527883687e−02},
{5.994768525584314e−01, 4.197609261363620e−01, −1.594928283631041e−02},
{5.967764663733787e−01, 4.197609261363617e−01, −1.324889095125780e−02},
{5.942410120098895e−01, 4.197609261363618e−01, −1.071343658776831e−02}};
double tab_ltpf_num_24000[4][5] = {
{3.989695588963494e−01, 5.142508607708275e−01, 1.004382966157454e−01,
−1.278893956818042e−02, −1.572280075461383e−03},
{3.948634911286333e−01, 5.123819208048688e−01, 1.043194926386267e−01,
−1.091999960222166e−02, −1.347408330627317e−03}
{3.909844475885914e−01, 5.106053522688359e−01, 1.079832524685944e−01,
−9.143431066188848e−03, −1.132124620551895e−03},
{3.873093888199928e−01, 5.089122083363975e−01, 1.114517380217371e−01,
−7.450287133750717e−03, −9.255514050963111e−04}};
double tab_ltpf_num_32000[4][7] = {
{2.982379446702096e−01, 4.652809203721290e−01, 2.105997428614279e−01,
3.766780380806063e−02, −1.015696155796564e−02, −2.535880996101096e−03,
−3.182946168719958e−04},
{2.943834154510240e−01, 4.619294002718798e−01, 2.129465770091844e−01,
4.066175002688857e−02, −8.693272297010050e−03, −2.178307114679820e−03,
−2.742888063983188e−04},
{2.907439213122688e−01, 4.587461910960279e−01, 2.151456974108970e−01,
4.350104772529774e−02, −7.295495347716925e−03, −1.834395637237086e−03,
−2.316920186482416e−04},
{2.872975852589158e−01, 4.557148886861379e−01, 2.172126950911401e−01,
4.620088878229615e−02, −5.957463802125952e−03, −1.502934284345198e−03,
−1.903851911308866e−04}};
double tab_ltpf_num_48000[4][11] = {
{1.981363739883217e−01, 3.524494903964904e−01, 2.513695269649414e−01,
1.424146237314458e−01, 5.704731023952599e−02, 9.293366241586384e−03,
−7.226025368953745e−03, −3.172679890356356e−03, −1.121835963567014e−03,
−2.902957238400140e−04, −4.270815593769240e−05},
```

```
{1.950709426598375e-01, 3.484660408341632e-01, 2.509988459466574e-01,
1.441167412482088e-01, 5.928947317677285e-02, 1.108923827452231e-02,
-6.192908108653504e-03, -2.726705509251737e-03, -9.667125826217151e-04,
-2.508100923165204e-04, -3.699938766131869e-05},
{1.921810055196015e-01, 3.446945561091513e-01, 2.506220094626024e-01,
1.457102447664837e-01, 6.141132133664525e-02, 1.279941396562798e-02,
-5.203721087886321e-03, -2.297324511109085e-03, -8.165608133217555e-04,
-2.123855748277408e-04, -3.141271330981649e-05},
{1.894485314175868e-01, 3.411139251108252e-01, 2.502406876894361e-01,
1.472065631098081e-01, 6.342477229539051e-02, 1.443203434150312e-02,
-4.254449144657098e-03, -1.883081472613493e-03, -6.709619060722140e-04,
-1.749363341966872e-04, -2.593864735284285e-05}};
```

Examples of tab_ltpf_den_fs[$p_{fr}$][k] are here provided (instead of "fs", the sampling rate is indicated):

```
double_tab_ltpf_den_8000[4][5] = {
{0.000000000000000e+00,  2.098804630681809e-01, 5.835275754221211e-01,
2.098804630681809e-01, 0.000000000000000e+00},
{0.000000000000000e+00,  1.069991860896389e-01, 5.500750019177116e-01,
3.356906254147840e-01, 6.698858366939680e-03},
{0.000000000000000e+00,  3.967114782344967e-02, 4.592209296082350e-01,
4.592209296082350e-01, 3.967114782344967e-02},
{0.000000000000000e+00,  6.698858366939680e-03, 3.356906254147840e-01,
5.500750019177116e-01, 1.069991860896389e-01} };
double_tab_ltpf den_16000[4][5] = {
{0.000000000000000e+00,  2.098804630681809e-01, 5.835275754221211e-01,
2.098804630681809e-01, 0.000000000000000e+00},
{0.000000000000000e+00,  1.069991860896389e-01, 5.500750019177116e-01,
3.356906254147840e-01, 6.698858366939680e-03},
{0.000000000000000e+00,  3.967114782344967e-02, 4.592209296082350e-01,
4.592209296082350e-01, 3.967114782344967e-02},
{0.000000000000000e+00,  6.698858366939680e-03, 3.356906254147840e-01,
5.500750019177116e-01, 1.069991860896389e-01}};
double_tab_ltpf den_24000[4][7] = {
{0.000000000000000e+00,  6.322231627323796e-02, 2.507309606013235e-01,
3.713909428901578e-01, 2.507309606013235e-01, 6.322231627323796e-02,
0.000000000000000e+00 },
{0.000000000000000e+00,  3.459272174099855e-02, 1.986515602645028e-01,
3.626411726581452e-01, 2.986750548992179e-01, 1.013092873505928e-01,
4.263543712369752e-03},
{0.000000000000000e+00,  1.535746784963907e-02, 1.474344878058222e-01,
3.374259553990717e-01, 3.374259553990717e-01, 1.474344878058222e-01,
1.535746784963907e-02 },
{0.000000000000000e+00,  4.263543712369752e-03, 1.013092873505928e-01,
2.986750548992179e-01, 3.626411726581452e-01, 1.986515602645028e-01,
3.459272174099855e-0}};
double_tab_ltpf den_32000[4][9] = {
{0.000000000000000e+00,  2.900401878228730e-02, 1.129857420560927e-01,
2.212024028097570e-01, 2.723909472446145e-01, 2.212024028097570e-01,
1.129857420560927e-01, 2.900401878228730e-02, 0.000000000000000e+00},
{0.000000000000000e+00,  1.703153418385261e-02, 8.722503785537784e-02,
1.961407762232199e-01, 2.689237982237257e-01, 2.424999102756389e-01,
1.405773364650031e-01, 4.474877169485788e-02, 3.127030243100724e-03},
{0.000000000000000e+00,  8.563673748488349e-03, 6.426222944493845e-02,
1.687676705918012e-01, 2.587445937795505e-01, 2.587445937795505e-01,
1.687676705918012e-01, 6.426222944493845e-02, 8.563673748488349e-03},
{0.000000000000000e+00,  3.127030243100724e-03, 4.474877169485788e-02,
1.405773364650031e-01, 2.424999102756389e-01, 2.689237982237257e-01,
1.961407762232199e-01, 8.722503785537784e-02, 1.703153418385261e-02}};
double_tab_ltpf_den_48000[4][13] = {
{0.000000000000000e+00, 1.082359386659387e-02, 3.608969221303979e-02,
7.676401468099964e-02, 1.241530577501703e-01, 1.627596438300696e-01,
1.776771417779109e-01, 1.627596438300696e-01, 1.241530577501703e-01,
7.676401468099964e-02, 3.608969221303979e-02, 1.082359386659387e-02,
0.000000000000000e+00},
{0.000000000000000e+00, 7.041404930459358e-03, 2.819702319820420e-02,
6.547044935127551e-02, 1.124647986743299e-01, 1.548418956489015e-01,
1.767122381341857e-01, 1.691507213057663e-01, 1.352901577989766e-01,
8.851425011427483e-02, 4.499353848562444e-02, 1.557613714732002e-02,
2.039721956502016e-03},
{0.000000000000000e+00, 4.146998467444788e-03, 2.135757310741917e-02,
5.482735584552816e-02, 1.004971444643720e-01, 1.456060342830002e-01,
1.738439838565869e-01, 1.738439838565869e-01, 1.456060342830002e-01,
1.004971444643720e-01, 5.482735584552816e-02, 2.135757310741917e-02,
4.146998467444788e-03},
```

-continued

{0.000000000000000e+00, 2.039721956502016e−03, 1.557613714732002e−02,
4.499353848562444e−02, 8.851425011427483e−02, 1.352901577989766e−01,
1.691507213057663e−01, 1.767122381341857e−01, 1.548418956489015e−01,
1.124647986743299e−01, 6.547044935127551e−02, 2.819702319820420e−02,
7.041404930459358e−03}}

With reference to the transition handling, five different cases are considered.

First case: ltpf_active=0 and mem_ltpf_active=0

$$\widehat{x_{ltpf}}(n) = \hat{x}(n) \text{ for } n = 0 \ldots \frac{N_F}{4}$$

Second case: ltpf_active=1 and mem_ltpf_active=0

$$\widehat{x_{ltpf}}(n) = \hat{x}(n) -$$

$$\frac{n}{\frac{N_F}{4}}\left[\sum_{k=0}^{L_{num}} c_{num}(k)\hat{x}(n-k) + \sum_{k=0}^{L_{den}} c_{den}(k, p_{fr})\widehat{x_{ltpf}}\left(n - p_{int} + \frac{L_{den}}{2} - k\right)\right]$$

$$\text{for } n = 0 \ldots \frac{N_F}{4}$$

Third case: ltpf_active=0 and mem_ltpf_active=1

$$\widehat{x_{ltpf}}(n) = \hat{x}(n) - \left(1 - \frac{n}{\frac{N_F}{4}}\right)\left[\sum_{k=0}^{L_{num}} c_{num}^{mem}(k)\hat{x}(n-k) + \right.$$

$$\left. \sum_{k=0}^{L_{den}} c_{den}^{mem}(k, p_{fr}^{mem})\widehat{x_{ltpf}}\left(n - p_{int}^{mem} + \frac{L_{den}}{2} - k\right)\right] \text{ for } n = 0 \ldots \frac{N_F}{4}$$

with $c_{num}^{mem}$, $c_{den}^{mem}$, $p_{int}^{mem}$ and $p_{fr}^{mem}$ are the filter parameters computed in the previous frame.

Fourth case: ltpf_active=1 and mem_ltpf_active=1 and $p_{int}=p_{int}^{mem}$ and $p_{fr}=p_{fr}^{mem}$ $$\widehat{x_{ltpf}}(n) = \hat{x}(n) - \sum_{k=0}^{L_{num}} c_{num}(k)\hat{x}(n-k) +$$

$$\sum_{k=0}^{L_{den}} c_{den}(k, p_{fr})\widehat{x_{ltpf}}\left(n - p_{int} + \frac{L_{den}}{2} - k\right) \text{ for } n = 0 \ldots \frac{N_F}{4}$$

Fifth case: ltpf_active=1 and mem_ltpf_active=1 and ($p_{int} \neq p_{int}^{mem}$ or $p_{fr} \neq p_{fr}^{mem}$)

$$\widehat{x_{ltpf}}'(n) = \hat{x}(n) - \left(1 - \frac{n}{\frac{N_F}{4}}\right)\left[\sum_{k=0}^{L_{num}} c_{num}^{mem}(k)\hat{x}(n-k) + \right.$$

$$\left. \sum_{k=0}^{L_{den}} c_{den}^{mem}(k, p_{fr}^{mem})\widehat{x_{ltpf}}'\left(n - p_{int}^{mem} + \frac{L_{den}}{2} - k\right)\right] \text{ for } n = 0 \ldots \frac{N_F}{4}$$

-continued $$\widehat{x_{ltpf}}(n) = \widehat{x_{ltpf}}'(n) - \frac{n}{\frac{N_F}{4}}\left[\sum_{k=0}^{L_{num}} c_{num}(k)\widehat{x_{ltpf}}'(n-k) + \sum_{k=0}^{L_{den}} c_{den}(k, p_{fr})\right.$$

$$\left. \widehat{x_{ltpf}}\left(n - p_{int} + \frac{L_{den}}{2} - k\right)\right] \text{ for } n = 0 \ldots \frac{N_F}{4}$$

with $N_f$ being the number of samples in one frame.

7.4 Further Advantages

As may be understood, the solution according to the examples above are transparent to the decoder. There is no need for signalling to the decoder, for example, that the first estimate or the second estimate has been selected.

Accordingly, there is no increased payload in the bitstream 63.

Further, there is no need for modifying the decoders to adapt to the new processed performed at the encoder. The decoder does not need to know that the present invention has been implemented. Therefore, the invention permits to increase the compatibility with the legacy systems.

8. Packet Lost Concealment

The pitch lag $T_{best}$ (19) as obtained by the apparatus 10, 60a, or 110 above may be used, at the decoder (e.g., 60b) for implementing a packet loss concealment (PLC) (also known as error concealment). PLC is used in audio codecs to conceal lost or corrupted packets during the transmission from the encoder to the decoder. In conventional technology, PLC may be performed at the decoder side and extrapolate the decoded signal either in the transform-domain or in the time-domain.

The pitch lag may be the main parameter used in pitch-based PLC. This parameter can be estimated at the encoder-side and encoded into the bitstream. In this case, the pitch lag of the last good frames are used to conceal the current lost frame.

A corrupted frame does not provide a correct audible output and shall be discarded.

For each decoded frame at the decoder, its validity may be verified. For example, each frame may have a field carrying a cyclical redundancy code (CRC) which is verified by performing predetermined operations provided by a predetermined algorithm. The procedure may be repeated to verify whether the calculated result corresponds to the value on the CRC field. If a frame has not been properly decoded (e.g., in view of interference in the transmission), it is assumed that some errors have affected the frame. Therefore, if the verification provides a result of incorrect decoding, the frame is held non-properly decoded (invalid, corrupted).

When a frame is acknowledged as non-properly decoded, a concealment strategy may be used to provide an audible output: otherwise, something like an annoying audible hole could be heard. Therefore, it is needed to find some form of frame which "fills the gap" kept open by the non-properly decoded frame. The purpose of the frame loss concealment procedure is to conceal the effect of any unavailable or corrupted frame for decoding.

8.1 Strategies for Concealment

A frame loss concealment procedure may comprise concealment methods for the various signal types. Best possible codec performance in error-prone situations with frame losses may be obtained through selecting the most suitable method. One of the packet loss concealment methods may be, for example, TCX Time Domain Concealment.

8.2 TCX Time Domain Concealment

The TCX Time Domain Concealment method is a pitch-based PLC technique operating in the time domain. It is best suited for signals with a dominant harmonic structure. An example of the procedure is as follow: the synthesized signal of the last decoded frames is inverse filtered with the LP filter as described in Section 8.2.1 to obtain the periodic signal as described in Section 8.2.2. The random signal is generated by a random generator with approximately uniform distribution in Section 8.2.3. The two excitation signals are summed up to form the total excitation signal as described in Section 8.2.4, which is adaptively faded out with the attenuation factor described in Section 8.2.6 and finally filtered with the LP filter to obtain the synthesized concealed time signal. If LTPF has been used in the last good frame, the LTPF may also be applied on the synthesized concealed time signal as described in Section 8.3. To get a proper overlap with the first good frame after a lost frame, the time domain alias cancelation signal is generated in Section 8.2.5.

8.2.1 LPC Parameter Calculation

The TCX Time Domain Concealment method is operating in the excitation domain. An autocorrelation function may be calculated on 80 equidistant frequency domain bands. Energy is pre-emphasized with the fixed pre-emphasis factor $\mu$

| $f_s$ | $\mu$ |
|---|---|
| 8000 | 0.62 |
| 16000 | 0.72 |
| 24000 | 0.82 |
| 32000 | 0.92 |
| 48000 | 0.92 |

The autocorrelation function is lag windowed using the following window $$W_{lag}(i) = \exp\left[-\frac{1}{2}\left(\frac{120\pi i}{f_s}\right)^2\right], \text{ for } i = 1\ldots 16$$

before it is transformed to time domain using an inverse evenly stacked DFT. Finally a Levinson Durbin operation may be used to obtain the LP filter, $a_c(k)$, for the concealed frame. An example is provided below:

$$e = R_L(0)$$
$$a^0(0) = 1$$

for $k = 1$ to $N_L$ do $$rc = \frac{-\sum_{n=0}^{k-1} a^{k-1}(n) R_L(k-n)}{e}$$

$$a^k(0) = 1$$

for $n = 1$ to $k - 1$ do $$a^k(n) = a^{k-1}(n) + rc \cdot a^{k-1}(k-n)$$

$$a^k(k) = rc$$

$$e = (1 - rc^2)e$$

The LP filter may be calculated only in the first lost frame after a good frame and remains in subsequently lost frames.

8.2.2 Construction of the Periodic Part of the Excitation

The last $$N_L + T_c + \frac{N}{2}$$

decoded time samples are first pre-emphasized with the pre-emphasis factor from Section 8.2.1 using the filter $$H_{pre-emph}(z) = 1 - \mu^{-1}$$

to obtain the signal $x_{pre}(k)$, where $T_c$ is the pitch lag value pitch_int or pitch_int+1 if pitch_fr>0. The values pitch_int and pitch_fr are the pitch lag values transmitted in the bitstream.

The pre-emphasized signal, $x_{pre}(k)$, is further filtered with the calculated inverse LP filter to obtain the prior excitation signal $exc'_p(k)$. To construct the excitation signal, $exc_p(k)$, for the current lost frame, $exc'_p(k)$ is repeatedly copied with $T_c$ as follows $$exc_p(k) = exc'_p(E - T_c + k), \text{ for } k = 0 \ldots N-1$$

where E corresponds to the last sample in $exc'_p(k)$. If the stability factor $\theta$ is lower than 1, the first pitch cycle of $exc'_p(k)$ is first low pass filtered with an 11-tap linear phase FIR (finite impulse response) filter described in the table below

| $f_s$ | Low pass FIR filter coefficients |
|---|---|
| 8000-16000 | {0.0053, 0.0000, −0.0440, 0.0000, 0.2637, 0.5500, 0.2637, 0.0000, −0.0440, 0.0000, 0.0053} |
| 24000-48000 | {−0.0053, −0.0037, −0.0140, 0.0180, 0.2668, 0.4991, 0.2668, 0.0180, −0.0140, −0.0037, −0.0053} |

The gain of pitch, $g'_p$, may be calculated as follows $$g'_p = \frac{\sum_{k=0}^{N/2} x_{pre}(N_L + k) \cdot x_{pre}(N_L + T_c + k)}{\sum_{k=0}^{N/3} x_{pre}(N_L + k)^2}$$

If pitch_fr=0 then $g_p = g'_p$. Otherwise, a second gain of pitch, $g''_p$, may be calculated as follows $$g''_p = \frac{\sum_{k=0}^{N/2} x_{pre}(N_L + 1 + k) \cdot x_{pre}(N_L + T_c + k)}{\sum_{k=0}^{N/3} x_{pre}(N_L + 1 + k)^2}$$

and $g_p = \max(g'_p, g''_p)$. If $g''_p > g'_p$ then $T_c$ is reduced by one for further processing. Finally, $g_p$ is bounded by $0 \leq g_p \leq 1$.

The formed periodic excitation, $exc_p(k)$, is attenuated sample-by-sample throughout the frame starting with one and ending with an attenuation factor, $\alpha$, to obtain $\widetilde{exc_p}(k)$. The gain of pitch is calculated only in the first lost frame after a good frame and is set to $\alpha$ for further consecutive frame losses.

8.2.3 Construction of the Random Part of the Excitation

The random part of the excitation may be generated with a random generator with approximately uniform distribution as follows $exc_{n,FB}(k) = \text{extract}(exc_{n,FB}(k-1) \cdot 12821 + 16831)$, for $k = 0 \ldots N-1$ where $exc_{n,FB}(-1)$ is initialized with 24607 for the very first frame concealed with this method and extract( )extracts the 16 LSB of the value. For further frames, $exc_{n,FB}(-1)$ is stored and used as next $exc_{n,FB}(-1)$.

To shift the noise more to higher frequencies, the excitation signal is high pass filtered with an 11-tap linear phase FIR filter described in the table below to get $exc_{n,HP}(k)$.

| fs | High pass FIR filter coefficients |
|---|---|
| 8000-16000 | {0, −0.0205, −0.0651, −0.1256, −0.1792, 0.8028, −0.1792, −0.1256, −0.0651, −0.0205, 0} |
| 24000-48000 | {−0.0517, −0.0587, −0.0820, −0.1024, −0.1164, 0.8786, −0.1164, −0.1024, −0.0820, −0.0587, −0.05171} |

To ensure that the noise may fade to full band noise with the fading speed dependently on the attenuation factor a, the random part of the excitation, $exc_n(k)$, is composed via a linear interpolation between the full band, $exc_{n,FB}(k)$, and the high pass filtered version, $exc_{n,HP}(k)$, as $exc_n(k) = (1-\beta) \cdot exc_{n,FB}(k) + \beta \cdot exc_{n,HP}(k)$, for $k = 0 \ldots N-1$ where $\beta = 1$ for the first lost frame after a good frame and $\beta = \beta_{-1} \cdot \alpha$ for the second and further consecutive frame losses, where $\beta_{-1}$ is $\beta$ of the previous concealed frame.

For adjusting the noise level, the gain of noise, $g'_n$, is calculated as $$g'_n = \sqrt{\frac{\sum_{k=0}^{N/2-1}(exc'_p(E - N/2 + 1 + k) - g_p \cdot exc'_p(E - N/2 + 1 - T_c + k))^2}{N/2}}$$

If $T_c = \text{pitch\_int}$ after Section 8.2.2, then $g_n = g'_n$. Otherwise, a second gain of noise, $g''_n$, is calculated as in the equation above, but with $T_c$ being pitch_int. Following, $g_n = \min(g'_n, g''_n)$.

For further processing, $g_n$ is first normalized and then multiplied by $(1.1 - 0.75 g_p)$ to get $\widehat{g_n}$.

The formed random excitation, $exc_n(k)$, is attenuated uniformly with $\widehat{g_n}$, from the first sample to sample five and following sample-by-sample throughout the frame starting with $\widehat{g_n}$ and ending with $\widehat{g_n} \cdot \alpha$ to obtain $\widetilde{exc_n}(k)$. The gain of noise, $g_n$, is calculated only in the first lost frame after a good frame and is set to $g_n \cdot \alpha$ for further consecutive frame losses.

8.2.4 Construction of the Total Excitation, Synthesis and Post-Processing

The random excitation, $\widetilde{exc_n}(k)$, is added to the periodic excitation, $\widetilde{exc_p}(k)$, to form the total excitation signal $exc_t(k)$. The final synthesized signal for the concealed frame is obtained by filtering the total excitation with the LP filter from Section 8.2.1 and post-processed with the de-emphasis filter.

8.2.5 Time Domain Alias Cancelation

To get a proper overlap-add in the case the next frame is a good frame, the time domain alias cancelation part, $x_{TDAC}(k)$, may be generated. For that, N−Z additional samples are created the same as described above to obtain the signal x(k) for $k = 0 \ldots 2N-Z$. On that, the time domain alias cancelation part is created by the following steps:

Zero filling the synthesized time domain buffer x(k)

$$\hat{x}(k) = \begin{cases} 0, & 0 \leq k < Z \\ x(k-Z), & Z \leq k < 2N \end{cases}$$

Windowing $\hat{x}(k)$ with the MDCT window $w_N(k)$ $\widehat{x_w}(k) = w_N(k) \cdot \hat{x}(k), 0 \leq k < 2N$ Reshaping from 2N to N $$y(k) = \begin{cases} -\widehat{x_w}\left(\frac{3N}{2} + k\right) - \widehat{x_w}\left(\frac{3N}{2} - 1 - k\right), & 0 \leq k < \frac{N}{2} \\ \widehat{x_w}\left(-\frac{N}{2} + k\right) - \widehat{x_w}\left(\frac{3N}{2} - 1 - k\right), & \frac{N}{2} \leq k < N \end{cases}$$

Reshaping from N to 2N $$\hat{y}(k) = \begin{cases} y\left(\frac{N}{2} + k\right), & 0 \leq k < \frac{N}{2} \\ -y\left(\frac{3N}{2} - 1 - k\right), & \frac{N}{2} \leq k < N \\ -y\left(\frac{3N}{2} - 1 - k\right), & N \leq k < \frac{3N}{2} \\ -y\left(-\frac{3N}{2} + k\right), & \frac{3N}{2} \leq k < 2N \end{cases}$$

Windowing $\hat{y}(k)$ with the flipped MDCT (Modified Discrete Cosine Transformation) (or MDST, Modified Discrete Sine Transformation, in other examples) window $w_N(k)$ $x_{TDAC}(k) = w_N(2N - 1 - k) \cdot \hat{y}(k), 0 \leq k < 2N$

8.2.6 Handling of Multiple Frame Losses

The constructed signal fades out to zero. The fade out speed is controlled by an attenuation factor, $\alpha$, which is dependent on the previous attenuation factor, $\alpha_{-1}$, the gain of pitch, $g_p$, calculated on the last correctly received frame, the number of consecutive erased frames, nbLostCmpt, and the stability, $\theta$. The following procedure may be used to compute the attenuation factor, $\alpha$

```
if (nbLostCmpt == 1)
    α = √g_p
        if (α > 0.98)
            α = 0.98
        else if (α < 0.925)
            α = 0.925
else if (nbLostCmpt == 2)
    α = (0.63 + 0.35 θ)· α_-1
        if α < 0.919
            α = 0.919;
else if (nbLostCmpt == 3)
    α = (0.652 + 0.328 θ) · α_-1
else if (nbLostCmpt == 4)
    α = (0.674 + 0.3 θ) · α_-1
else if (nbLostCmpt == 5) {
    α = (0.696 + 0.266 θ) · α_-1
else
    α = (0.725 + 0.225 θ) · α_-1
g_p = α
```

The factor $\theta$ (stability of the last two adjacent scalefactor vectors $scf_{-2}(k)$ and $scf_{-3}(k)$) may be obtained, for example, as:

$$\theta = 1.25 - \frac{1}{25}\sum_{k=0}^{15}(scf_{-1}(k) - scf_{-2}(k))^2$$

where $scf_{-2}(k)$ and $scf_{-1}(k)$ are the scalefactor vectors of the last two adjacent frames. The factor $\theta$ is bounded by $0 \leq \theta \leq 1$, with larger values of $\theta$ corresponding to more stable signals. This limits energy and spectral envelope fluctuations. If there are no two adjacent scalefactor vectors present, the factor $\theta$ is set to 0.8.

To prevent rapid high energy increase, the spectrum is low pass filtered with $X_s(0)=X_s(0)\cdot 0.2$ and $X_s(1)=X_s(1)\cdot 0.5$.

9. LTPF and PLC with the Same Pitch Lag Information

Figure 9:
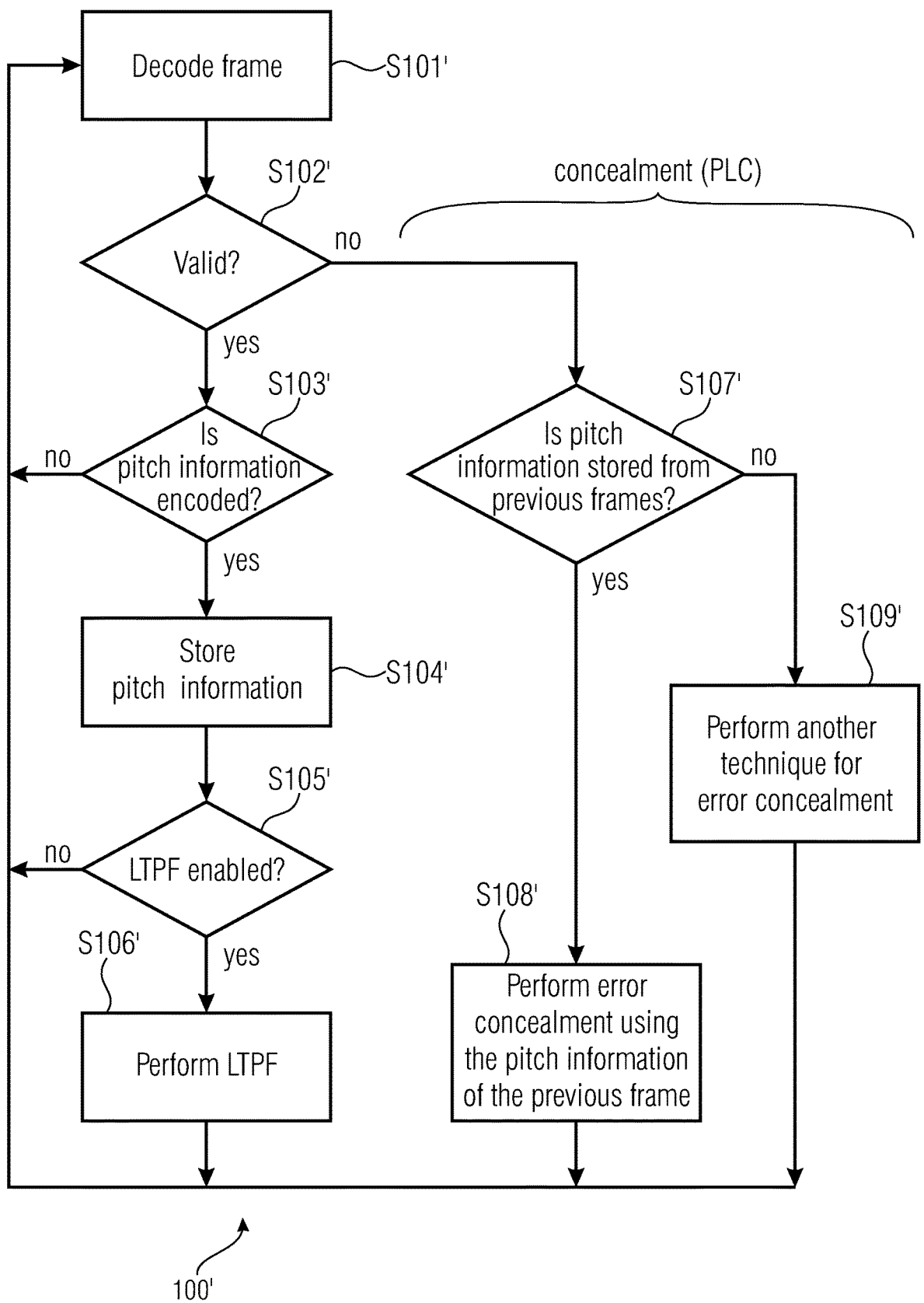

FIG. 9 shows a general example of a method 100' which may be used for operating the decoder 60b. At step S101', an encoded version of a signal may be decoded. In examples, the frame may be received (e.g., via a Bluetooth connection) and/or obtained from a storage unit. The pitch lag $T_{best}$ (selected between $T_1$ and $T_2$ as discussed above) may be used for both PLC and LTPF.

At step S102', the validity of the frame is checked (for example with CRC, parity, etc.). If the invalidity of the frame is acknowledged, concealment is performed (see below).

Otherwise, if the frame is held valid, at step S103' it is checked whether pitch information is encoded in the frame. In some examples, the pitch information is encoded only if the harmonicity has been acknowledged as being over a particular threshold (which may indicate, for example, harmonicity sufficiently high for performing LTPF and/or PLC, for example).

If at S103' it is acknowledged that the pitch information is actually encoded, then the pitch information is decoded and stored at step S104'. Otherwise, the cycle ends and a new frame may be decoded at S101'.

Subsequently, at step S105', it is checked whether the LTPF is enabled. If it is verified that the LTPF is enabled, then LTPF is performed at step S106. Otherwise, the LTPF is skipped; the cycle ends; and a new frame may be decoded at S101'.

With reference to the concealment, the latter may be subdivided into steps. At step S107', it is verified whether the pitch information of the previous frame (or a pitch information of one of the previous frames) is stored in the memory (i.e., it is at disposal).

If it is verified that the searched pitch information is stored, then error concealment may be performed at step S108. MDCT (or MDST) frame resolution repetition with signal scrambling, and/or TCX time domain concealment, and/or phase ECU may be performed.

Otherwise, if at S107' it is verified that no fresh pitch information is stored (as a consequence that the decoder had not transmitted the pitch lag, for example) a different concealment technique, per se known and not implying the use of a pitch information provided by the encoder, may be used at step S109'. Some of these techniques may be based on estimating the pitch information and/or other harmonicity information at the decoder. In some examples, no concealment technique may be performed in this case.

After having performed the concealment, the cycle ends and a new frame may be decoded at S101'.

It is to be noted that the pitch lag used by the PLC is the value 19 ($t_{best}$) prepared by the apparatus 10 and/or 60b, on the basis of the selection between the estimations $T_1$ and $T_2$, as discussed above.

10. Other Examples

Figure 7:
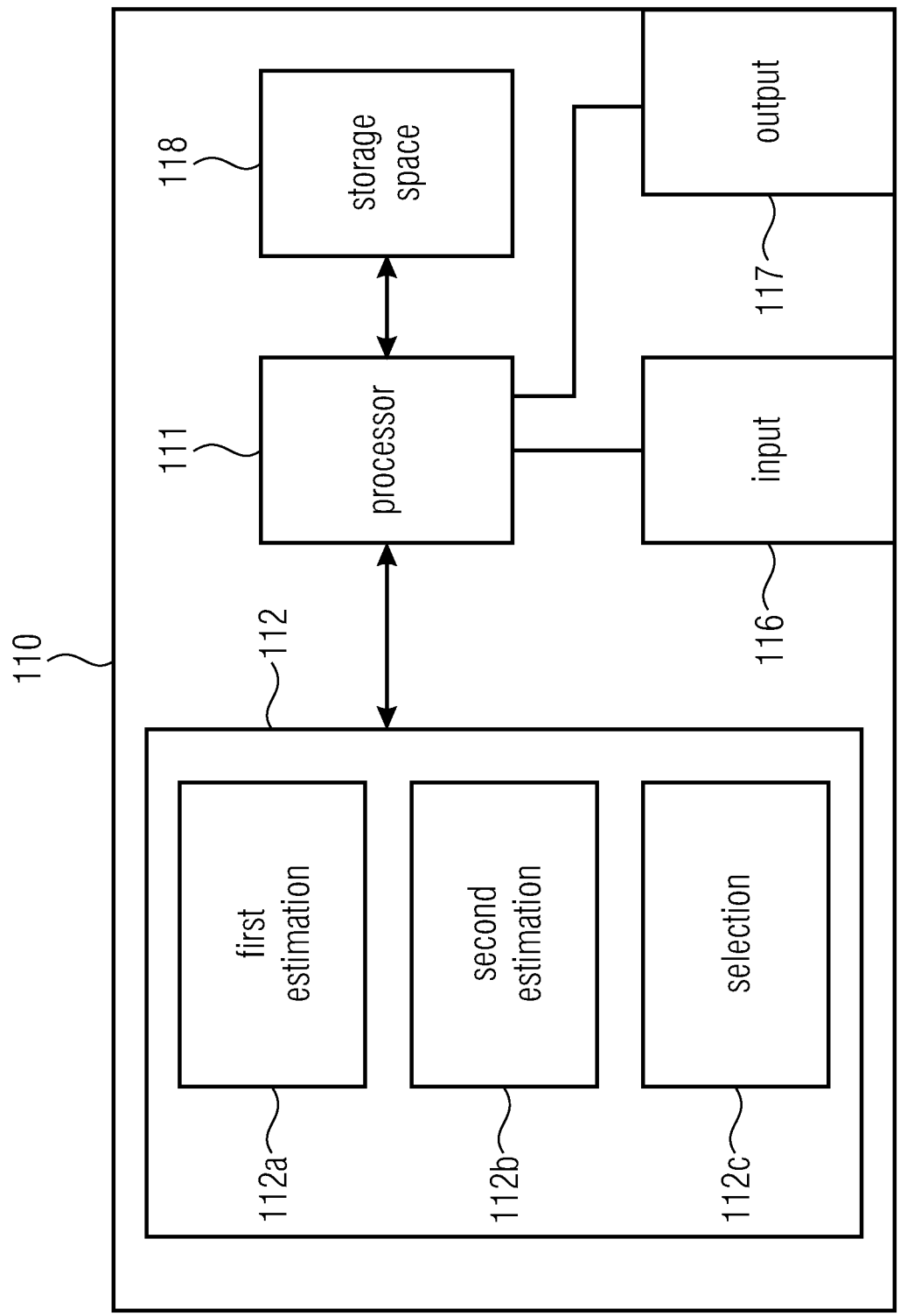

FIG. 7 shows an apparatus 110 which may implement the apparatus 10 and/or 60a perform at least some steps of the methods above. The apparatus 110 may comprise a processor 111 and a non-transitory memory unit 112 storing instructions (e.g., a program) which, when executed by the processor 111, may cause the processor 111 to perform a first estimation 112a (e.g., such as to implement the first estimator 11), a second estimation 112b (e.g., such as to implement the second estimator 12), and/or a selectin 112c (e.g., such as to implement the selector 18). The apparatus 110 may comprise an input unit 116, which may obtain an input information signal (e.g., an audio signal). The apparatus may store a bitstream, for example in the storage space 128.

Figure 8:
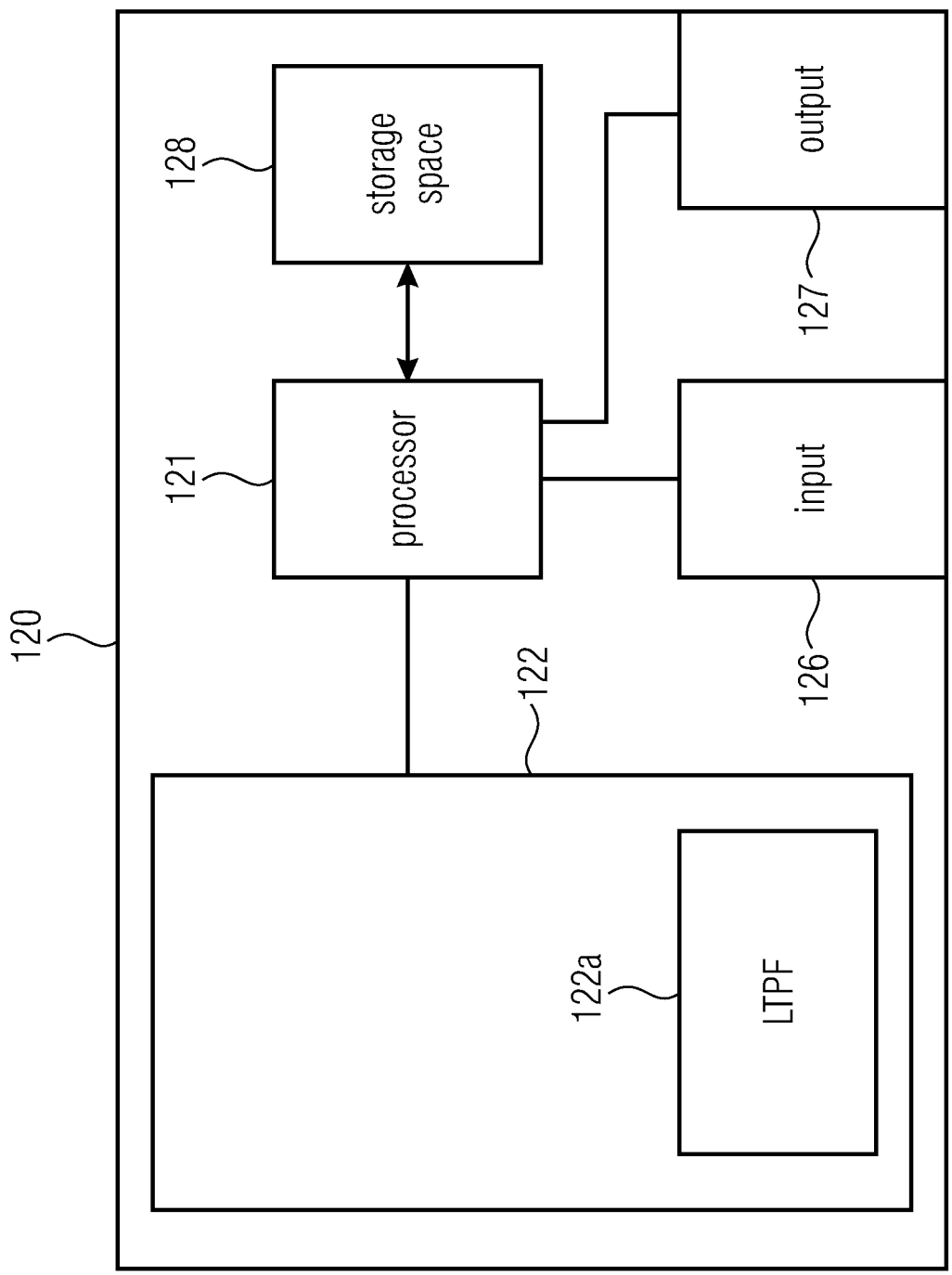

FIG. 8 shows an apparatus 120 which may implement the decoder 60b, and/or perform an LTPF filtering, for example. The apparatus 120 may comprise a processor 121 and a non-transitory memory unit 122 storing instructions 122a (e.g., a program) which, when executed by the processor 121, may cause the processor 121 to perform, inter alia, an LTPF filtering operation, e.g., on the basis of a parameter obtained from the encoder. The apparatus 120 may comprise an input unit 126, which may obtain a decoded representation of an information signal (e.g., an audio signal). The processor 121 may therefore perform processes to obtain a decoded representation of the information signal. This decoded representation may be provided to external units using an output unit 127. The output unit 127 may comprise, for example, a communication unit to communicate to external devices (e.g., using wireless communication, such as Bluetooth) and/or external storage spaces. The processor 121 may save the decoded representation of the audio signal in a local storage space 128.

In examples, the systems 110 and 120 may be the same device.

Depending on certain implementation requirements, examples may be implemented in hardware. The implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine readable carrier. In other words, an example of method is, therefore, a computer program having a program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus for encoding an information signal comprising a plurality of frames, the apparatus comprising at least one processor configured to:
   acquire a first estimate, the first estimate being an estimate of a pitch lag for a current frame, wherein the first estimate is acquired as a lag that maximizes a first correlation function associated to the current frame;
   acquire a second estimate, the second estimate being another estimate of the pitch lag for the current frame, wherein the at least one processor is conditioned by a pitch lag selected at a previous frame so as to acquire the second estimate for the current frame, wherein the at least one processor is configured to acquire the second estimate-by searching a lag which maximizes a second correlation function in a second subinterval which comprises the pitch lag selected for the previous frame,
   choose a selected value by performing a selection between the first estimate and the second estimate on a basis of a first and a second correlation measurements, wherein the performing the selection includes performing a comparison between:
      a downscaled version of a first normalized autocorrelation measurement associated to the current frame and acquired at a lag corresponding to the first estimate; and
      a second normalized autocorrelation measurement associated to the current frame and acquired at a lag corresponding to the second estimate,
   so as to select the first estimate when the second normalized autocorrelation measurement is less than the downscaled version of the first normalized autocorrelation measurement, and/or
   to select the second estimate when the second normalized autocorrelation measurement is greater than the downscaled version of the first normalized autocorrelation measurement,
   wherein the at least one processor is further configured to encode data used for performing long-term post filtering (LTPF) at a decoder, the data used for performing the LTPF comprising the selected value.

2. The apparatus of claim 1, wherein the performing the LTPF includes controlling a long term postfilter at the decoder.

3. The apparatus of claim 1, wherein the at least one processor is configured to compare a harmonicity of the selected value with a predetermined LTPF threshold, so as to avoid encoding the selected value in case the harmonicity of the selected value is below the predetermined threshold.

4. The apparatus of claim 1, wherein:
   the second subinterval comprises lags within a distance less than a pre-defined lag number threshold from the pitch lag selected for the previous frame.

5. The apparatus of claim 1, wherein the at least one processor is configured to:
   search for a maximum value among second correlation function values to associate the second estimate to a lag associated to the maximum value among the second correlation function values.

6. The apparatus of claim 1, wherein the first correlation function is restricted to lags in a first subinterval.

7. The apparatus of claim 6, wherein the first subinterval comprises one or more lags greater than the second subinterval, and/or at least one of the lags in the second subinterval is comprised in the first subinterval.

8. The apparatus of claim 1, wherein the at least one processor is configured to:
weight correlation measurement values of the first correlation function using a monotonically decreasing weight function before searching for the lag that maximizes the first correlation function.

9. The apparatus of claim 1, wherein the at least one processor is configured to acquire the first estimate $T_1$ by performing at least one of the following operations:

$$T_1 = \underset{k=k_{min}\cdots k_{max}}{\operatorname{argmax}} R_w(k)$$

$$R_w(k) = R(k)w(k) \text{ for } k = k_{min}\cdots k_{max}$$

$$w(k) = 1 - 0.5 \frac{(k-k_{min})}{(k_{max}-k_{min})} \text{ for } k = k_{min}\cdots k_{max}$$

$$R(k) = \sum_{n=0}^{N-1} x(n)x(n-k) \text{ for } k = k_{min}\cdots k_{max}$$

w(k) being a weighting function, $k_{min}$ and $k_{max}$ being associated to a minimum lag and a maximum lag, R being an autocorrelation measurement value estimated on a basis of the information signal or a processed version thereof and N being a frame length, and x being the information signal.

10. The apparatus of claim 1, wherein the at least one processor is configured to acquire the second estimate $T_2$ by performing:

$$T_2 = \underset{k=k'_{min}\cdots k'_{max}}{\operatorname{argmax}} R(k)$$

with $k_{min}'=\max(k_{min}, T_{prev}-\delta)$, $k_{max}'=\min(k_{max}, T_{prev}+\delta)$, $T_{prev}$ being a selected estimate in a preceding frame, $\delta$ being a distance from $T_{prev}$, $k_{min}$ and $k_{max}$ being associated to a minimum lag and a maximum la, and R being an autocorrelation measurement value estimated on a basis of the information signal or a processed version thereof.

11. The apparatus of claim 1, wherein the at least one processor is configured to perform a selection of a pitch lag estimate $T_{curr}$ in terms of $$T_{curr} = \begin{cases} T_1 & \text{if } normcorr(x, N, T_2) \leq \alpha\, normcorr(x, N, T_1) \\ T_2 & \text{otherwise} \end{cases}$$

with $T_1$ being the first estimate, $T_2$ being the second estimate, x being a value of the information signal or a processed version thereof, normcorr(x, N, T) being a normalized correlation measurement of a signal x of length N at lag T, and $\alpha$ being a downscaling coefficient.

12. The apparatus of claim 1, wherein the information signal is an audio signal.

13. The apparatus of claim 1, wherein the at least one processor is configured to acquire the first and second normalized autocorrelation measurements using a same correlation function up to a weighting function.

14. The apparatus of claim 1, wherein the at least one processor is configured to acquire the first normalized autocorrelation measurement as a normalized version of the first estimate up to a weighting function.

15. The apparatus of claim 1, wherein the at least one processor is configured to acquire the second normalized autocorrelation measurement as a normalized version of the second estimate.

16. The apparatus of claim 1, further comprising a transform coder configured to generate a representation of the information signal or a processed version thereof.

17. A system comprising an encoder side and a decoder side, the encoder side comprising the apparatus according to claim 1, the decoder side comprising a long term postfilter controlled on a basis of a pitch lag estimate selected by the at least one processor.

18. A method for determining a pitch lag for a signal divided into frames, comprising:
performing a first estimation for a current frame to acquire a first estimate as a lag that maximizes a first correlation function associated to the current frame;
performing a second estimation for the current frame to acquire a second estimate by searching for a lag which maximizes a second correlation function in a second subinterval which comprises a pitch lag selected for a previous frame, wherein performing the second estimation is acquired on a basis of a result of selecting performed at the previous frame; and
selecting between the first estimate acquired at the first estimation and the second estimate acquired at the second estimation on a basis of a first and a second normalized autocorrelation measurements,
wherein the selecting comprises performing a comparison between:
a downscaled version of the first normalized autocorrelation measurement, associated to the current frame and acquired at a lag corresponding to the first estimate;
the second normalized autocorrelation measurement, associated to the current frame and acquired at a lag corresponding to the second estimate; and
selecting the first estimate when the second normalized autocorrelation measurement is less than the downscaled version of the first normalized autocorrelation measurement, and/or selecting the second estimate when the second normalized autocorrelation measurement is greater than the downscaled version of the first normalized autocorrelation measurement,
wherein the method further comprises using the selected lag for long-term post filtering (LTPF).

19. The method of claim 18, further comprising using the selected lag for packet lost concealment (PLC).

20. A method for encoding a bitstream for a signal divided into frames, comprising:
performing a first estimation for a current frame to acquire a first estimate as a lag that maximizes a first correlation function associated to the current frame;
performing a second estimation for the current frame to acquire a second estimate by searching for a lag which maximizes a second correlation function in a second subinterval which comprises a pitch lag selected for a previous frame, wherein performing the second estimation is acquired on a basis of a result of selecting performed at the previous frame; and
selecting between the first estimate acquired at the first estimation and the second estimate acquired at the second estimation on a basis of a first and a second normalized autocorrelation measurements,
wherein the selecting comprises performing a comparison between:
a downscaled version of the first normalized autocorrelation measurement, associated to the current frame and acquired at a lag corresponding to the first estimate;

the second normalized autocorrelation measurement, associated to the current frame and acquired at a lag corresponding to the second estimate; and selecting the first estimate when the second normalized autocorrelation measurement is less than the downscaled version of the first normalized autocorrelation measurement, and/or selecting the second estimate when the second normalized autocorrelation measurement is greater than the downscaled version of the first normalized autocorrelation measurement, wherein the method further comprises encoding data used for performing long-term post filtering (LTPF) at a decoder, the data used for performing the LTPF comprising the selected lag.

21. The method of claim 20, further comprising using the selected lag for packet lost concealment (PLC).

22. A non-transitory digital storage medium having a computer program stored thereon to perform, when the computer program is run by a computer, a method for encoding a bitstream for a signal divided into frames, the method comprising:

performing a first estimation for a current frame to acquire a first estimate as a lag that maximizes a first correlation function associated to the current frame;

performing a second estimation for the current frame to acquire a second estimate by searching for a lag which maximizes a second correlation function in a second subinterval which comprises a pitch lag selected for a previous frame, wherein performing the second estimation is acquired on a basis of a result of selecting performed at the previous frame; and selecting between the first estimate acquired at the first estimation and the second estimate acquired at the second estimation on a basis of a first and a second normalized autocorrelation measurements, wherein the selecting comprises performing a comparison between:

a downscaled version of the first normalized autocorrelation measurement, associated to the current frame and acquired at a lag corresponding to the first estimate;

the second normalized autocorrelation measurement, associated to the current frame and acquired at a lag corresponding to the second estimate; and selecting the first estimate when the second normalized autocorrelation measurement is less than the downscaled version of the first normalized autocorrelation measurement, and/or selecting the second estimate when the second normalized autocorrelation measurement is greater than the downscaled version of the first normalized autocorrelation measurement, wherein the method further comprises encoding data used for performing long-term post filtering (LTPF) at a decoder, the data used for performing the LTPF comprising the selected lag.

* * * * *